(12) United States Patent
Cheng et al.

(10) Patent No.: US 12,399,440 B2
(45) Date of Patent: Aug. 26, 2025

(54) LITHOGRAPHY SYSTEM AND METHODS

(71) Applicant: Taiwan Semiconductor Manufacturing Co., Ltd., Hsinchu (TW)

(72) Inventors: Chen-Pin Cheng, Hsinchu (TW); Tsun-Cheng Tang, Hsinchu (TW); Guo-Chih Yen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 209 days.

(21) Appl. No.: 18/328,637

(22) Filed: Jun. 2, 2023

(65) Prior Publication Data

US 2024/0402623 A1 Dec. 5, 2024

(51) Int. Cl.
*G03F 7/00* (2006.01)
*G03F 1/64* (2012.01)
*G03F 1/84* (2012.01)

(52) U.S. Cl.
CPC ............ *G03F 7/70983* (2013.01); *G03F 1/64* (2013.01); *G03F 1/84* (2013.01); *G03F 7/70591* (2013.01);
(Continued)

(58) Field of Classification Search
CPC ............. G03F 7/70983; G03F 7/70316; G03F 7/70591; G03F 7/70033; G03F 7/70041; G03F 7/70; G03F 7/70483–70541; G03F 7/70691; G03F 7/70716; G03F 7/70741; G03F 7/708; G03F 7/70808; G03F 7/70825; G03F 7/70833; G03F 7/70841; G03F 7/7085; G03F 7/70858; G03F 7/70866; G03F 7/70883; G03F 7/70916; G03F 7/7095; G03F 7/70958; G03F 7/70975; G03F 7/70991; G03F 1/62; G03F 1/64; G03F 1/68; G03F 1/82; G03F 1/84;
(Continued)

(56) References Cited

U.S. PATENT DOCUMENTS 5,652,657 A * 7/1997 Yoshii ..................... G01N 21/94
356/394
6,346,986 B1 * 2/2002 Nguyen ..................... G03F 1/64
430/4
(Continued)

FOREIGN PATENT DOCUMENTS

CN 112987490 A 6/2021
KR 100620160 B1 * 9/2006 ......... G03F 7/70741
(Continued)

OTHER PUBLICATIONS

English translation of KR100620160, published Sep. 1, 2006. (Year: 2006).*

*Primary Examiner* — Christina A Riddle
(74) *Attorney, Agent, or Firm* — Seed Intellectual Property Law Group LLP

(57) ABSTRACT

A method includes: placing a mask on a mask stage; placing a pellicle assembly on a pellicle stage, the pellicle assembly including a pellicle; determining whether a defect level of the pellicle is less than a selected value by scanning the pellicle by a first optical detector; forming a protected mask assembly by mounting the pellicle assembly to the mask assembly; and performing semiconductor processing using the protected mask assembly.

20 Claims, 20 Drawing Sheets

(52) U.S. Cl.
CPC ........ *G03F 7/7085* (2013.01); *G03F 7/70975* (2013.01)

(58) Field of Classification Search
CPC ..... G03F 1/86; G03F 7/70605–706851; G01B 11/161–164; G01B 9/02; G01B 9/02022; G01B 9/02024; G01B 9/02029; G01B 9/021–029; G01N 2021/451; G01N 2021/456; G01N 2021/458; G01N 21/45; G01N 21/453; G01N 21/455; G01N 21/456
USPC ................ 430/5; 355/18, 30, 52–55, 66–77; 356/237.1–237.6
See application file for complete search history.

(56) References Cited

U.S. PATENT DOCUMENTS

| | | | | |
|---|---|---|---|---|
| 6,521,889 B1* | 2/2003 | Ina | ......................... | G01N 21/88 356/336 |
| 9,513,229 B1* | 12/2016 | Suzuki | ................ | G03F 7/7085 |
| 2001/0026355 A1* | 10/2001 | Aoki | ................... | G03F 7/70933 355/53 |
| 2007/0035715 A1* | 2/2007 | Choi | ................... | G03F 7/70983 355/75 |
| 2008/0252869 A1* | 10/2008 | Mori | .................... | G03F 9/7088 355/53 |
| 2016/0078608 A1* | 3/2016 | Na | .......................... | G06T 7/001 382/149 |
| 2016/0139501 A1* | 5/2016 | Kim | ........................ | G03F 1/62 430/5 |
| 2018/0364561 A1* | 12/2018 | Vles | ..................... | G03F 7/7085 |
| 2020/0012204 A1* | 1/2020 | Van Der Meulen | ........................ | G03F 7/70825 |
| 2020/0057383 A1 | 2/2020 | Shih et al. | | |
| 2024/0053281 A1* | 2/2024 | Magana | .............. | G03F 7/70916 |

FOREIGN PATENT DOCUMENTS

| | | |
|---|---|---|
| TW | 201619693 A | 6/2016 |
| TW | 202229849 A | 8/2022 |

* cited by examiner

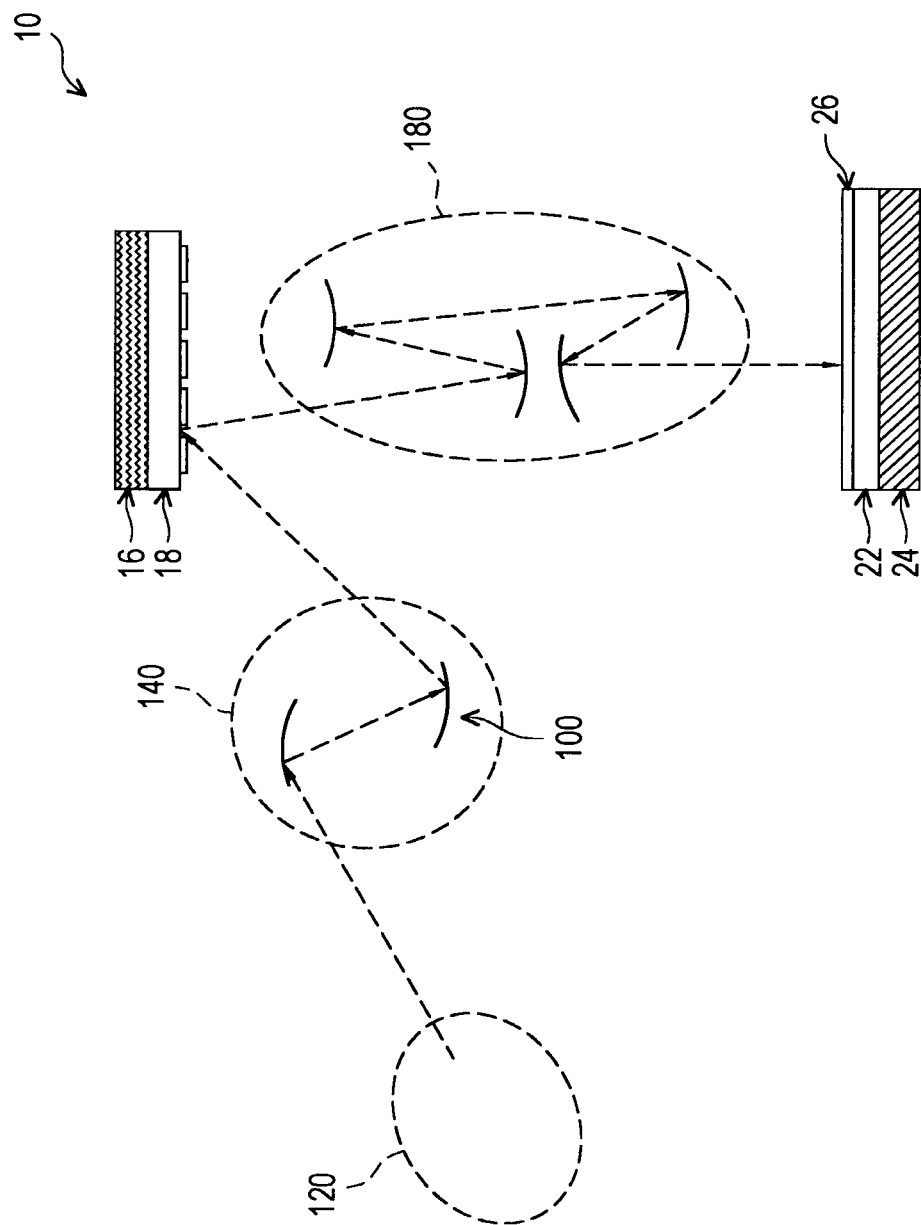

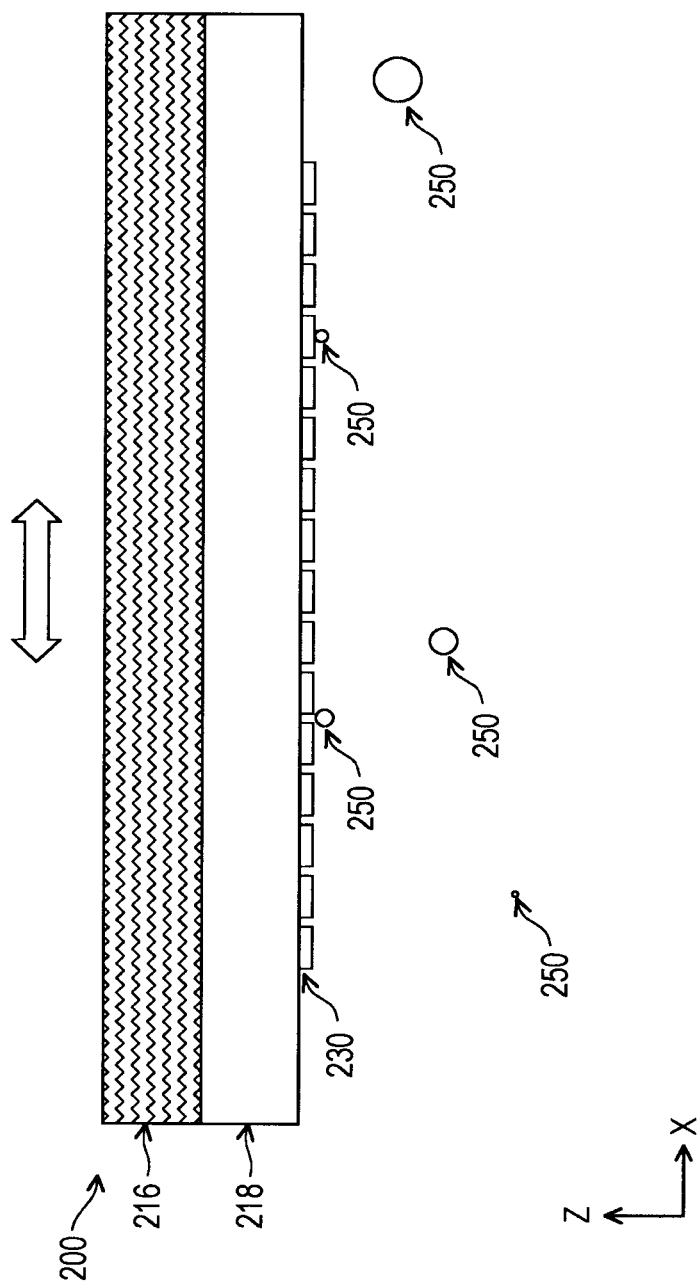

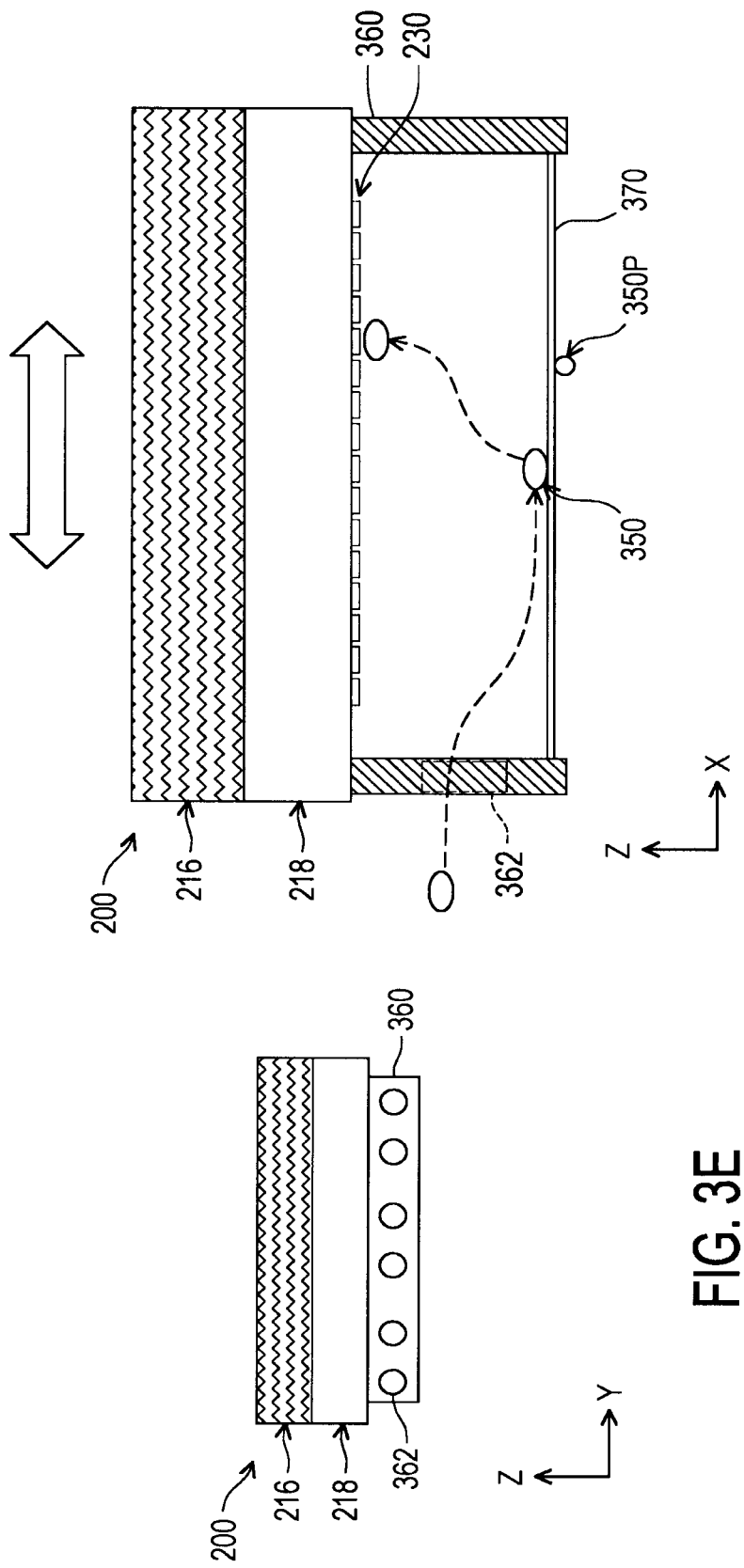

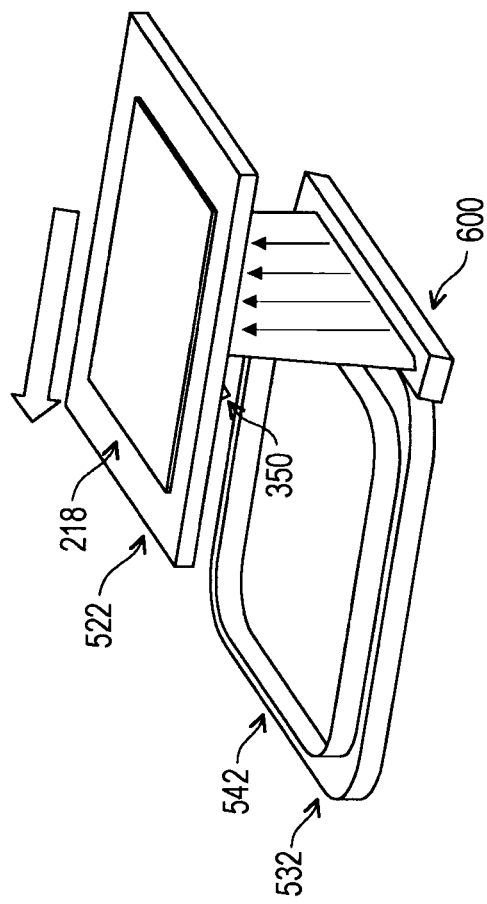
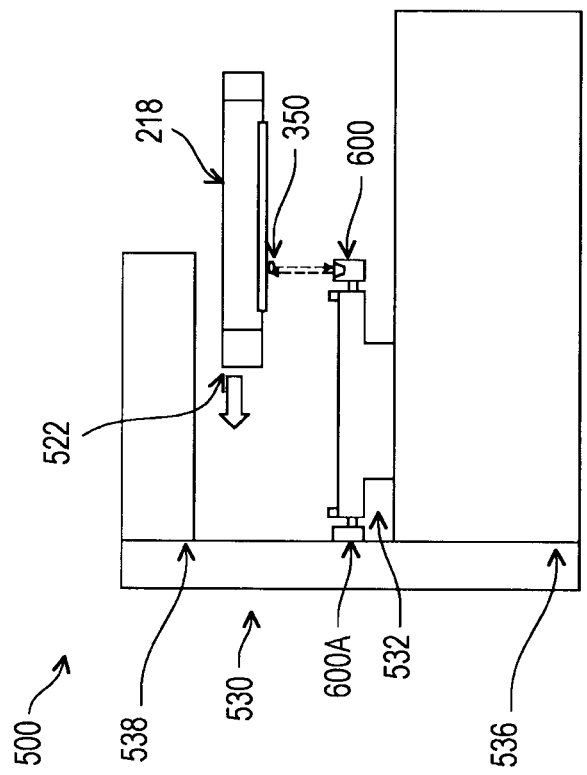
FIG. 6B
FIG. 6A

LITHOGRAPHY SYSTEM AND METHODS

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A and 1B are views of portions of a lithography scanner according to embodiments of the present disclosure.

FIGS. 2A-2C are views of various embodiments of a mask assembly of the lithography scanner according to various aspects of the present disclosure.

FIGS. 3A-3G are views illustrating use of a pellicle in accordance with various embodiments.

FIGS. 6A-6F are views depicting a process for in-situ scanning a pellicle and a mask according to various aspects of the present disclosure.

DETAILED DESCRIPTION

Figure 1B:
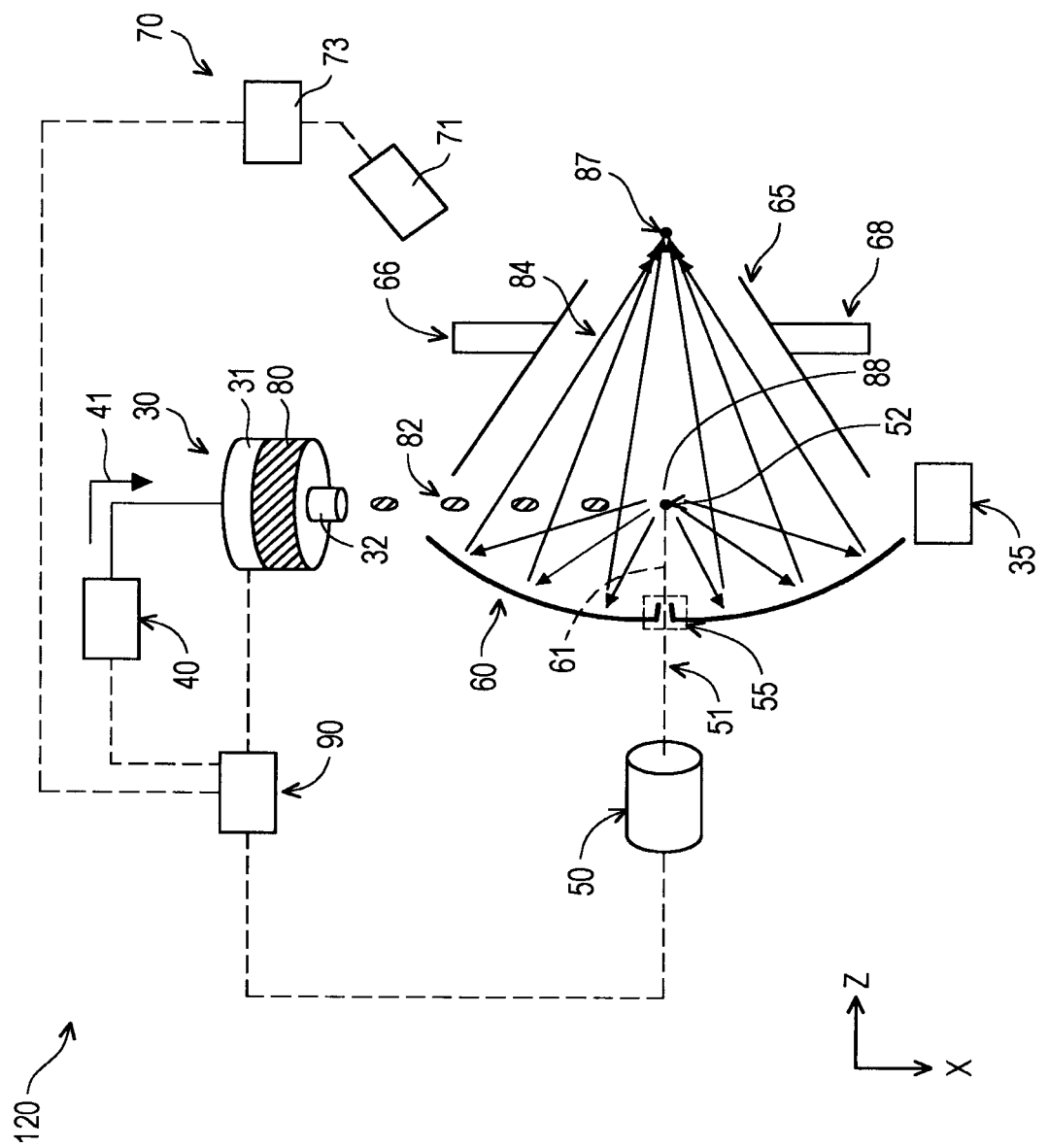

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Terms such as "about," "roughly," "substantially," and the like may be used herein for ease of description. A person having ordinary skill in the art will be able to understand and derive meanings for such terms.

The present disclosure is generally related to lithography equipment for fabricating semiconductor devices, and more particularly to methods of inspecting a pellicle that is part of a mask assembly. Dimension scaling (down) is increasingly difficult in advanced technology nodes. Lithography techniques employ ever shorter exposure wavelengths, including deep ultraviolet (DUV; about 193-248 nanometers), extreme ultraviolet (EUV; about 10-100 nanometers; particularly 13.5 nanometers), and X-ray (about 0.01-10 nanometers) to ensure accurate patterning at the scaled-down dimensions. In an EUV scanner, EUV light is generated by a light source, and reflected toward a wafer by multiple mirrors and a reflective mask. Only a fraction of the EUV light reaches the wafer, such that increasing intensity of EUV light generated by the light source is a topic of much interest.

In EUV lithography, patterns of a mask or reticle are reflected toward a wafer to expose and print the patterns to the wafer. Particles from an EUV scanner chamber, which is a vacuum environment due to EUV absorption, can transport freely onto a pattern-carrying surface of the reticle, forming reticle defects and leading to pattern failure in all exposure fields. Mounting a pellicle, which may be a nanometer-scale thickness thin film that is transparent to EUV wavelengths, at a selected distance from the reticle can prevent reticle defects formed by particles released from the tool. The distance is selected to be far enough away from the reticle focus plane so that no pattern failure occurs due to any particle on the outer surface of the pellicle (e.g., the surface of the pellicle facing away from the reticle), as long as the particle size and EUV transparency are small and clear, respectively.

The pellicle is beneficial to prevent some particles from settling on the reticle. However, particles on an outer surface of the pellicle (e.g., a surface facing away from the reticle) may reduce EUV power, which increases cycle time. In another example, pattern failure may still occur due to particles at an inner region of the pellicle, which are referred to as "inner on-pellicle defects" (IOPDs). IOPDs can be formed in various ways. For example, the IOPD may be formed during a thin film process that forms the pellicle or during mounting to the mask assembly. The IOPDs are prone to falling onto the mask after mounting of the pellicle, such as during wafer fabrication.

Even with a lot of effort on improving mounting process cleanness (e.g., increased mask cleaning, pellicle particle inspection, mounting tool and environment cleanness and the like), particles are present on the pellicle after mounting in about 1% of cases. For example, prior to pellicle mounting, an inspection process may be performed for pellicle qualification. After pellicle mounting, a reticle inspection tool may not be used, because the pellicle under tension is easily ruptured by fluctuation and external vibration. One effective method to identify IOPD after mounting is performing wafer exposure and checking whether pattern failure occurs. However, yield is reduced by the number of wafers sent for wafer defect inspection. The wafer defect inspection tool may also be heavily taxed by IOPD detection, and have reduced availability for other inspection tasks. Once the IOPD attaches on the pattern surface, an increased batch size results in an increased reduction in yield.

In embodiments of this disclosure, a method that scans the pellicle in-situ (e.g., inside a mounter) is described. The method may be performed by scanning the pellicle using an optical imager mounted to a mask stage as the pellicle moves to a mating position. When a particle is detected on the pellicle, the pellicle may be removed from the lithography assembly for replacement or rework, which reduces tool downtime. Embodiments of the disclosure provide real-time scanning and particle gating before a final mounting operation. As such, particles not only on the mask surface but also on the pellicle inner membrane may be identified. Particles of size less than about 2 micrometers (um) and their position(s) can be determined. When a particle(s) is detected on the pellicle, another clean pellicle may be attached. In some embodiments, a second optical imager mounted to a pellicle may similarly scan the mask surface for particles. In response to a particle(s) being detected on the mask, the mask may be cleaned. As such, fall-on particles and rework flow issues may be avoided, reducing tool downtime and improving yield.

FIGS. 1A and 1B depict a lithography exposure system 10 in accordance with various embodiments. The lithography exposure system 10 is described in detail to give context for the description of processes for detecting particles that is provided with reference to FIGS. 6A-7.

FIG. 1A is a schematic and diagrammatic view of a lithography exposure system 10, in accordance with some embodiments. In some embodiments, the lithography exposure system 10 is an extreme ultraviolet (EUV) lithography system designed to expose a resist layer by EUV radiation, and may also be referred to as the EUV system 10. The EUV system 10 may also be referred to as an EUV scanner or lithography scanner. The lithography exposure system 10 includes a light source 120, an illuminator 140, a mask stage 16, a projection optics module (or projection optics box (POB)) 30 and a substrate stage 24, in accordance with some embodiments. The elements of the lithography exposure system 10 can be added to or omitted, and the disclosure should not be limited by the embodiment.

The light source 120 is configured to generate light radiation having a wavelength ranging between about 1 nm and about 100 nm in certain embodiments. In one particular example, the light source 120 generates an EUV radiation with a wavelength centered at about 13.5 nm. Accordingly, the light source 120 is also referred to as an EUV radiation source. However, it should be appreciated that the light source 120 should not be limited to emitting EUV radiation. The light source 120 can be utilized to perform any high-intensity photon emission from excited target fuel.

In various embodiments, the illuminator 140 includes various refractive optic components, such as a single lens or a lens system having multiple reflectors 100, for example lenses (zone plates) or alternatively reflective optics (for EUV lithography exposure system), such as a single mirror or a mirror system having multiple mirrors in order to direct light from the light source 120 onto the mask stage 16, particularly to a mask 18 secured on the mask stage 16. In embodiments in which the light source 120 generates light in the EUV wavelength range, reflective optics are employed. In some embodiments, the illuminator 140 includes at least two lenses, at least three lenses, or more.

The mask stage 16 is configured to secure the mask 18. In some embodiments, the mask stage 16 includes an electrostatic chuck (e-chuck) to secure the mask 18. One reason an e-chuck is beneficial is that gas molecules absorb EUV radiation and the e-chuck is operable in the lithography exposure system for the EUV lithography patterning that is maintained in a vacuum environment to avoid EUV intensity loss. In the present disclosure, the terms mask, photomask, and reticle are used interchangeably. In the present embodiment, the mask 18 is a reflective mask. One exemplary structure of the mask 18 includes a substrate with a suitable material, such as a low thermal expansion material (LTEM) or fused quartz. In various examples, the LTEM includes $TiO_2$ doped $SiO_2$, or other suitable materials with low thermal expansion. The mask 18 includes a reflective multilayer deposited on the substrate. The mask stage 16 is operable to translate in two horizontal directions, such as an X-axis direction and a Y-axis direction, so as to expose multiple different regions of the semiconductor wafer 22 to light having a pattern generated by the mask 18. The semiconductor wafer 22 may have a mask layer 26 thereon, which may be a photoresist layer that is sensitive to the light carrying the pattern of the mask 18.

The projection optics module (or projection optics box (POB)) 180 is configured for imaging the pattern of the mask 18 on to a semiconductor wafer 22 secured on the substrate stage 24 of the lithography exposure system 10. In some embodiments, the POB 180 has refractive optics (such as for a UV lithography exposure system) or alternatively reflective optics (such as for an EUV lithography exposure system) in various embodiments. The light directed from the mask 18, carrying the image of the pattern defined on the mask, is collected by the POB 180. The illuminator 140 and the POB 180 are collectively referred to as an optical module of the lithography exposure system 10. In some embodiments, the POB 180 includes at least six reflective optics.

In some embodiments, the semiconductor wafer 22 may be made of silicon or other semiconductor materials. Alternatively or additionally, the semiconductor wafer 22 may include other elementary semiconductor materials such as germanium (Ge). In some embodiments, the semiconductor wafer 22 is made of a compound semiconductor such as silicon carbide (SIC), gallium arsenic (GaAs), indium arsenide (InAs), or indium phosphide (InP). In some embodiments, the semiconductor wafer 22 is made of an alloy semiconductor such as silicon germanium (SiGe), silicon germanium carbide (SiGeC), gallium arsenic phosphide (GaAsP), or gallium indium phosphide (GalnP). In some other embodiments, the semiconductor wafer 22 may be a silicon-on-insulator (SOI) or a germanium-on-insulator (GOI) substrate.

In addition, the semiconductor wafer 22 may have various device elements. Examples of device elements that are formed in the semiconductor wafer 22 include transistors (e.g., metal oxide semiconductor field effect transistors (MOSFET), complementary metal oxide semiconductor (CMOS) transistors, bipolar junction transistors (BJT), high voltage transistors, high-frequency transistors, p-channel and/or n-channel field-effect transistors (PFETs/NFETs), etc.), diodes, and/or other applicable elements. Various processes are performed to form the device elements, such as deposition, etching, implantation, photolithography, annealing, and/or other suitable processes. In some embodiments, the semiconductor wafer 22 is coated with a resist layer sensitive to the EUV radiation. Various components including those described above are integrated together and are operable to perform lithography processes.

The lithography exposure system 10 may further include other modules or be integrated with (or be coupled with) other modules, such as a cleaning module designed to provide hydrogen gas to the light source 120. The hydrogen gas helps reduce contamination in the light source 120. Further description of the light source 120 is provided with reference to FIG. 1B.

In FIG. 1B, the light source 120 is shown in a diagrammatical view, in accordance with some embodiments. In some embodiments, the light source 120 employs a dual-pulse laser produced plasma (LPP) mechanism to generate plasma 88 and further generate EUV radiation from the plasma. The light source 120 includes a droplet generator 30, a droplet receptacle 35, a laser generator 50, a laser produced plasma (LPP) collector 60, a monitoring device 70 and a controller 90. Some or all of the above-mentioned elements of the light source 120 may be held under vacuum. It should be appreciated that the elements of the light source 120 can be added to or omitted, and should not be limited by the embodiment.

The droplet generator 30 is configured to generate a plurality of droplets 82, which may be elongated, of a target fuel 80 to a zone of excitation at which at least one laser pulse 51 from the laser generator 50 hits the droplets 82 along an x-axis, as shown in FIG. 1B. In an embodiment, the target fuel 80 includes tin (Sn). In an embodiment, the droplets 82 may be formed with an elliptical shape. In an embodiment, the droplets 82 are generated at a rate of about 50 kilohertz (kHz) and are introduced into the zone of excitation in the light source 120 at a speed of about 70 meters per second (m/s). Other material can also be used for the target fuel 80, for example, a tin containing liquid material such as eutectic alloy containing tin, lithium (Li), and xenon (Xe). The target fuel 80 in the droplet generator 30 may be in a liquid phase.

The laser generator 50 is configured to generate at least one laser pulse to allow the conversion of the droplets 82 into plasma 88. In some embodiments, the laser generator 50 is configured to produce a laser pulse 51 to the lighting point 52 to convert the droplets 82 to plasma 88 which generates EUV radiation 84. The laser pulse 51 is directed through window (or lens) 55, and irradiates droplets 82 at the lighting point 52. The window 55 is formed in the sectional collector 60 and adopts a suitable material substantially transparent to the laser pulse 51. The droplet receptacle 35 catches and collects unused droplets 82 and/or scattered material of the droplets 82 resulting from the laser pulse 51 striking the droplets 82.

The plasma emits EUV radiation 84, which is collected by the collector 60. The collector 60 further reflects and focuses the EUV radiation 84 for the lithography processes performed through an exposure tool. In some embodiments, the collector 60 has an optical axis 61 which is parallel to the z-axis and perpendicular to the x-axis. The collector 60 may includes a single section, as shown, or at least two sections that are offset from each other in the z-axis direction. The collector 60 may further include a vessel wall 65 having first and second pumps 66, 68 attached thereto. In some embodiments, the first and second pumps 66, 68 include scrubbers configured to remove particulates and/or gases from the collector 60. The first and second pumps 66, 68 may be collectively referred to as "the pumps 66, 68" herein.

In an embodiment, the laser generator 50 is a carbon dioxide (CO2) laser source. In some embodiments, the laser generator 50 is used to generate the laser pulse 51 with single wavelength. The laser pulse 51 is transmitted through an optic assembly for focusing and determining incident angle of the laser pulse 51. In some embodiments, the laser pulse 51 has a spot size of about 200-300 μm, such as 225 μm. The laser pulse 51 is generated to have certain driving power to meet wafer production targets, such as a throughput of 125 wafers per hour (WPH). For example, the laser pulse 51 is equipped with about 23 KW driving power. In various embodiments, the driving power of the laser pulse 51 is at least 20 KW, such as 27 kW.

The monitoring device 70 is configured to monitor one or more conditions in the light source 70 so as to produce data for controlling configurable parameters of the light source 120. In some embodiments, the monitoring device 70 includes a metrology tool 71 and an analyzer 73. In cases where the metrology tool 71 is configured to monitor condition of the droplets 82 supplied by the droplet generator 30, the metrology tool may include an image sensor, such as a charge coupled device (CCD), complementary metal oxide semiconductor sensor (CMOS) sensor or the like. The metrology tool 71 produces a monitoring image including image or video of the droplets 82 and transmits the monitoring image to the analyzer 73. In cases where the metrology tool 71 is configured to detect energy or intensity of the EUV light 84 produced by the droplet 82 in the light source 12, the meteorology tool 71 may include a number of energy sensors. The energy sensors may be any suitable sensors that are able to observe and measure energy of electromagnetic radiation in the ultraviolet region.

The analyzer 73 is configured to analyze signals produced by the metrology tool 71 and outputs a detection signal to the controller 90 according to an analyzing result. For example, the analyzer 73 includes an image analyzer. The analyzer 73 receives the data associated with the images transmitted from the metrology tool 71 and performs an image analysis process on the images of the droplets 82 in the excitation zone. Afterwards, the analyzer 73 sends data related to the analysis to the controller 90. The analysis may include a flow path error or a position error.

In some embodiments, two or more metrology tools 71 are used to monitor different conditions of the light source 120. One is configured to monitor condition of the droplets 82 supplied by the droplet generator 30, and the other is configured to detect energy or intensity of the EUV light 84 produced by the droplet 82 in the light source 120. In some embodiments, the metrology tool 71 is a final focus module (FFM) and positioned in the laser source 50 to detect light reflected from the droplet 82.

The controller 90 is configured to control one or more elements of the light source 120. In some embodiments, the controller 90 is configured to drive the droplet generator 30 to generate the droplets 82. In addition, the controller 90 is configured to drive the laser generator 50 to fire the laser pulse 51. The generation of the laser pulse 51 may be controlled to be associated with the generation of droplets 82 by the controller 90 so as to make the laser pulse 51 hit each target 82 in sequence.

In some embodiments, the droplet generator 30 includes a reservoir 31 and a nozzle assembly 32. The reservoir 31 is configured for holding the target material 80. In some embodiments, one gas line 41 is connected to the reservoir 31 for introducing pumping gas, such as argon, from a gas source 40 into the reservoir 31. By controlling the gas flow in the gas line 41, the pressure in the reservoir 31 can be manipulated. For example, when gas is continuously supplied into the reservoir 31 via the gas line 41, the pressure in the reservoir 31 increases. As a result, the target material 80 in the reservoir 31 can be forced out of the reservoir 31 in the form of droplets 82.

Figure 2C:
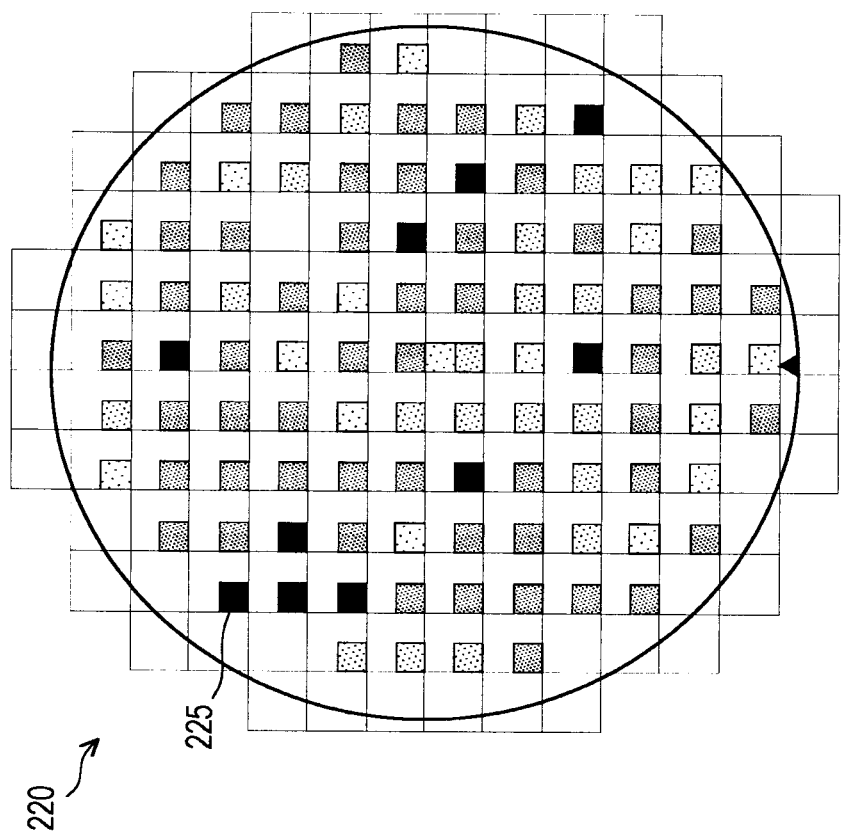
Figure 2B:
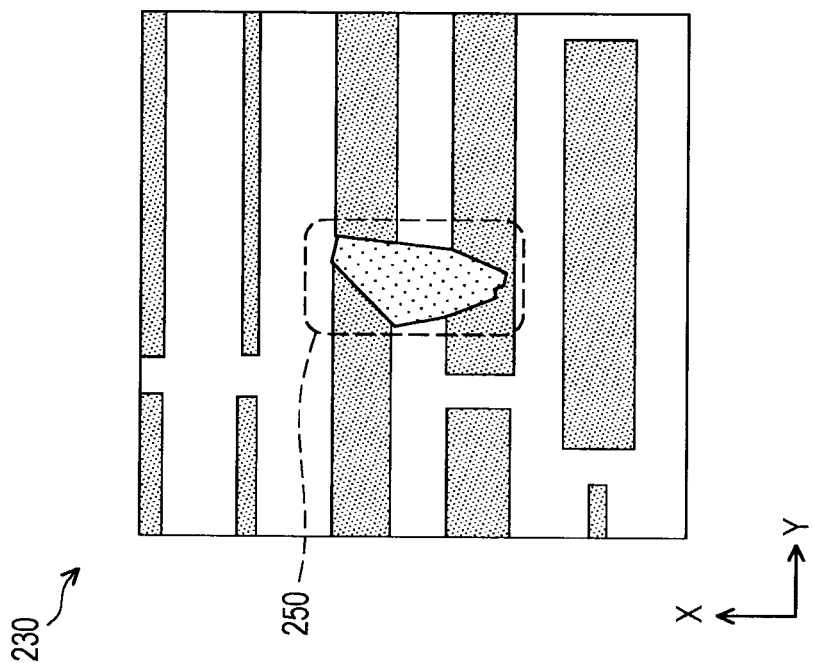

FIGS. 2A-2C are views of various embodiments of a mask assembly 200 of a lithography scanner according to various aspects of the present disclosure. FIG. 2A is a side view of a mask assembly 200. FIG. 2B is a top view of a mask pattern 230 of the mask assembly 200. FIG. 2C is a diagram illustrating exposure errors in regions 225 of a semiconductor wafer 220. FIGS. 2A-2C are described in detail to provide context for the processes for detecting particles that are described with reference to FIGS. 6A-7.

In FIG. 2A, the mask assembly 200 includes a mask stage 216 and a mask 218 attached thereto. The mask stage 216 and the mask 218 may be the mask stage 16 and the mask 18, respectively, of FIGS. 1A and 1B. The mask 218 includes mask patterns 230 that may be located in a layer of the mask 218 facing reflectors of the illuminator 140 and the POB 30 on either side of the mask assembly 200.

Particles 250 may be present in the lithography scanner. The particles 250 may include different types of particles generated by different sources in the lithography scanner. For example, the particles 250 may include tin particles generated by the light source 120 during formation of the plasma 88. The particles 250 may include SiC particles generated by movement of the mask assembly 200 in the X- and Y-axis directions. The particles 250 may include carbon particles generated by a pod or carrier used for transporting the mask 218 in and out of the lithography scanner. Other particles 250 having different material composition may be generated by other sources internal or external to the lithography scanner. One or more of the particles 250 may settle on the surface of the mask 218 on one or more mask pattern regions of the mask patterns 230. The particles 250 that settle on the reticle surface form reticle defects that can lead to pattern failure in all exposure fields (e.g., regions 225 of FIG. 2C) of a wafer.

FIG. 2B shows a view of the mask patterns 230 with a particle 250 thereon. The mask patterns 230 are exposed to the internal environment of the lithography scanner. While the mask assembly 200 is in the lithography scanner, the particle 250 may fall on the mask 218. The particle 250 may form a short circuit or bridge or merger between one or more pattern regions of the mask patterns 230. When the pattern of the mask 218 is transferred to a semiconductor wafer, an electrical defect, such as a short circuit or bridge or merger, may occur between features of the semiconductor wafer. For example, neighboring semiconductor fins or neighboring conductive traces may merge unintentionally, which may result in failure of an integrated circuit die formed in the semiconductor wafer.

FIG. 2C shows a diagrammatic view of a semiconductor wafer 220, which may be the semiconductor wafer 22 of FIGS. 1A and 1B. The view of FIG. 2C may be a diagram of an image generated by a metrology tool that analyzes the semiconductor wafer 220. During exposure, in which light carrying the pattern of the mask patterns 230 is incident on the semiconductor wafer 220, the particle 250 alters the pattern, which is transferred repeatedly onto some or all of the regions 225 of the semiconductor wafer 220. As such, quality of the semiconductor wafer 220 is reduced, reducing productivity of the lithography scanner.

Figure 3B:
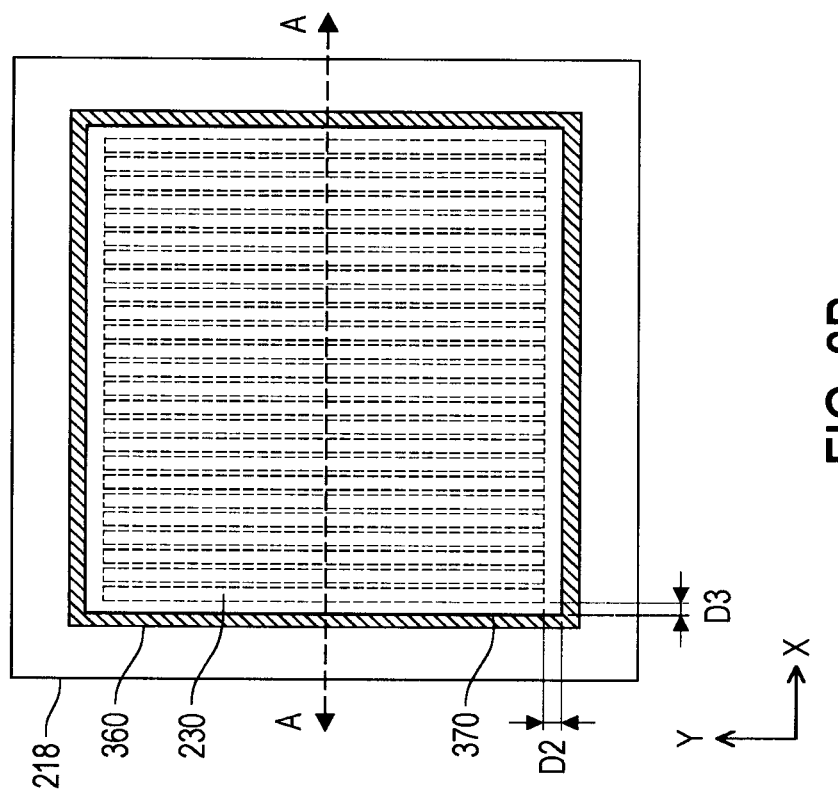
Figure 3A:
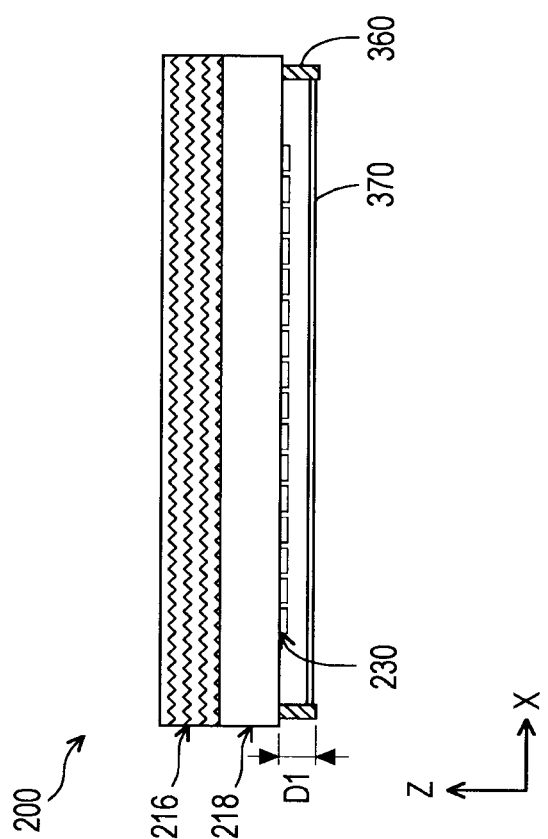

FIGS. 3A-3G are diagrammatic views showing a pellicle 370 and frame 360 installed on the mask assembly 200 to prevent the particles 250 from attaching to the mask 218. In FIGS. 3A and 3B, the pellicle 370 is shown suspended by the frame 360 over the mask patterns 230. The pellicle 370 may be a nanoscale thickness thin film that has high transparency (e.g., >90%) to EUV wavelengths (e.g., 13.5 nm). For example, the pellicle 370 may have thickness in the Z-axis direction in a range of about 1 nm to about 10 nm.

The frame 360 has height D1, which may be in a range of about 1 millimeter to about 3 millimeters, or more. The height D1 is about the same as a separation distance between the pellicle 370 and the mask patterns 230 in the Z-axis direction. The frame 360 may have rectangular (e.g., square) shape in the XY-plane, as shown in FIG. 3B. The frame 360 may be adjacent to the mask patterns 230 on four sides, as shown. The frame 360 may be offset horizontally in the X-axis and Y-axis directions from the mask patterns 230. For example, the frame 360 may be offset from the mask patterns by a second distance D2 in the Y-axis direction and by a third distance D3 in the X-axis direction. The distances D1, D2, D3 may be the same as each other. In some embodiments, one or more of the distances D1-D3 is different from others of the distances D1-D3. For example, the distance D1 may be in the range of about 1-3 millimeters as described above, and the second and third distances D2, D3 may be in a range of about 0.5 millimeters to about 10 millimeters. Mounting the pellicle 370 on the frame 360 can prevent mask defects formed by particles released by the lithography scanner. Generally, the distance D1 is sufficiently large such that any particle 250 less than a selected size (e.g., diameter less than about 500 nm) that settles on the outside surface of the pellicle 370 is far enough from a focal plane of incident light that the particle 250 does not cause a pattern defect failure.

Figure 3C:
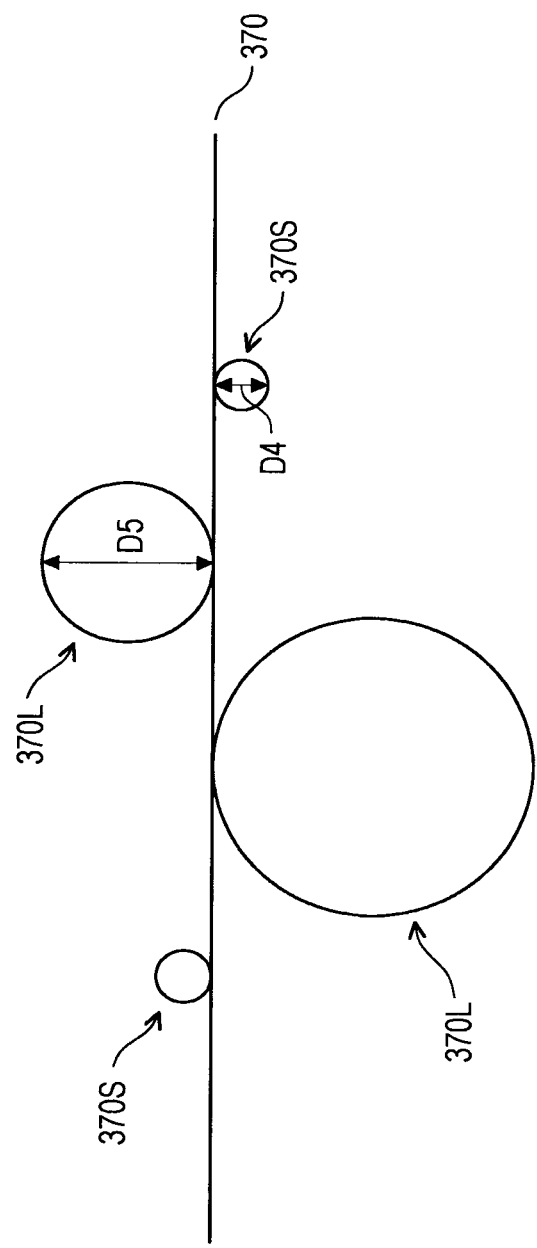

FIG. 3C illustrates presence of particles 370S, 370L on the pellicle 370. The particles 370S, 370L may include small particles 370S and large particles 370L. The small particles 370S may have diameter D4 that is less than a particle detection resolution of an inspection tool, and the large particles 370L may have a diameter D5 that is greater than the particle detection resolution. The particles 370S, 370L may be the same as the particles 250 described above with reference to FIGS. 2A-2C. Prior to mounting the pellicle 370 onto the mask assembly 200, an inspection process may be performed by the inspection tool for pellicle qualification. The qualification process may have a particle detection range or resolution outside of which, particles may not be identified. For example, the particle detection resolution may be about 300 nm. The diameter D4 of the small particles 370S may be less than 300 nm, such as less than 200 nm, less than 100 nm, less than 50 nm, or the like. The diameter D5 of the large particles 370L may be greater than 300 nm. As such, the large particles 370L on the inside and outside surfaces of the pellicle 370 may be identified by the inspection tool, and the small particles 370S may not be identified by the inspection tool, and may remain on the pellicle 370 when mounted.

After mounting the pellicle 370, further inspection by the inspection tool may damage the pellicle 370, due to the pellicle 370 being under tension, making it easily ruptured by fluctuation and external vibration. As such, the small particles 370S may remain on the inside and outside surfaces of the pellicle 370 after the pellicle 370 is mounted to the mask assembly 200.

Figure 3D:
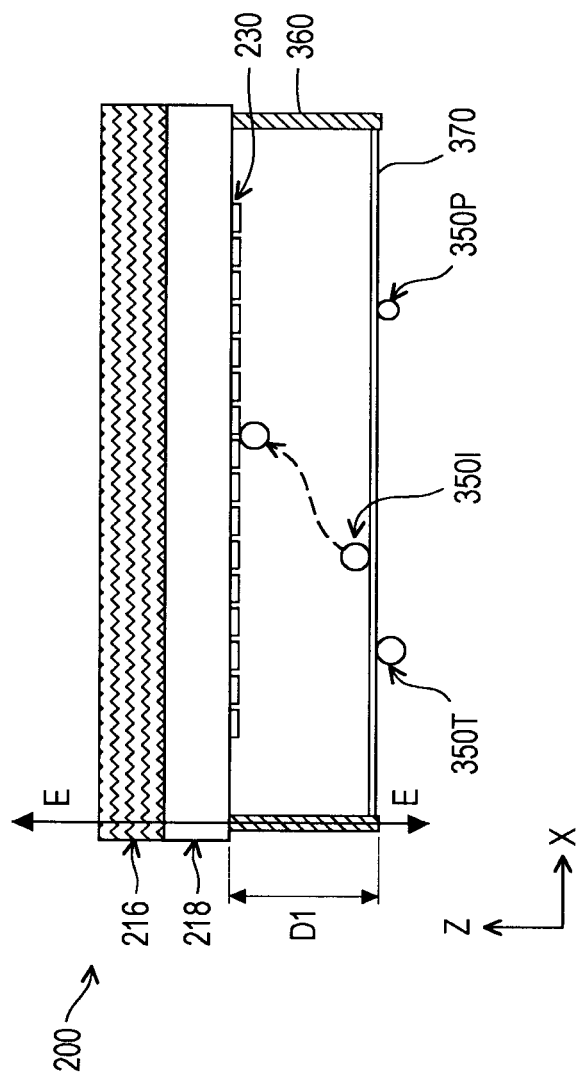

FIG. 3D illustrates the mask assembly 200 with the pellicle 370 mounted thereto after a period of operation. Generally, the pellicle 370 may be operated for a selected number of wafers before being replaced. For example, the pellicle 370 may be said to have a "lifetime" of about 10,000 wafers, about 15,000 wafers, or the like. In another example, the pellicle 370 may have a lifetime measured in number of moves or translations. Exposure of all regions of a single wafer may include tens, hundreds or thousands of moves. During manufacture of integrated circuit dies on the semiconductor wafer 220, the mask assembly 200 may translate back and forth along the XY plane, and particles 350T, 350P may attach to the outside surface of the pellicle 370, as shown in FIG. 3D. The particles 350T, 350P may include tool particles 350T and pod particles 350P, among other particle types described above with reference to FIGS. 2A-2G. Over time, as the particles 350T, 350P accumulate on the pellicle 370, and due to repeated acceleration along the XY plane of the pellicle 370, the pellicle 370 may deform or rupture and be replaced.

One or more inner particles or "IOPD" 350I may be on an inner surface of the pellicle 370 that faces the reticle 218. As described above with reference to FIG. 3C, the inner particles 350I may be small particles 350S that are present on the pellicle 370 prior to and following mounting. For example, the IOPD 350I may be formed during a thin film process that forms the pellicle 370 or may be induced during mounting of the pellicle 370 to the reticle 218. In another example, the inner particles 350I may be due to bond breaking of pellicle elements after EUV exposure. In yet another example, the inner particles 350I may be tool particles 350T or pod particles 350P that enter the space between the frame 360, the pellicle 370 and the reticle 218, which is described in greater detail with reference to FIGS. 3E and 3F.

FIGS. 3E and 3F illustrate a side view of the frame 360 (FIG. 3E) and formation of inner pellicle defects due to openings or holes 362 in the frame 360 (FIG. 3F). Because the pellicle 370 is operated in a vacuum or near-vacuum environment, the holes 362 are present in the frame 360 that are beneficial to balance pressure between the space underneath the pellicle 370 and an internal environment of the lithography scanner in which the mask assembly 200 is disposed. Without the holes 362, the pellicle 370 would be prone to rupture in the vacuum or near-vacuum environment due to air pressure in the space underneath the pellicle 370 between the pellicle 370 and the mask patterns 230 following mounting of the pellicle 370 to the mask 218.

As shown in FIG. 3F, due to the holes 362 in the frame 360, a particle 350 may enter the space between the pellicle 370 and the mask patterns 230 through the holes 362. The particle 350 may settle on the inside surface of the pellicle 370, then may fall and settle on the mask patterns 230. The particle 350 illustrated in FIG. 3F may be referred to as an "inner pellicle defect." The inner pellicle defect is difficult to detect, and may lead to significant reduction of yield.

Figure 3G:
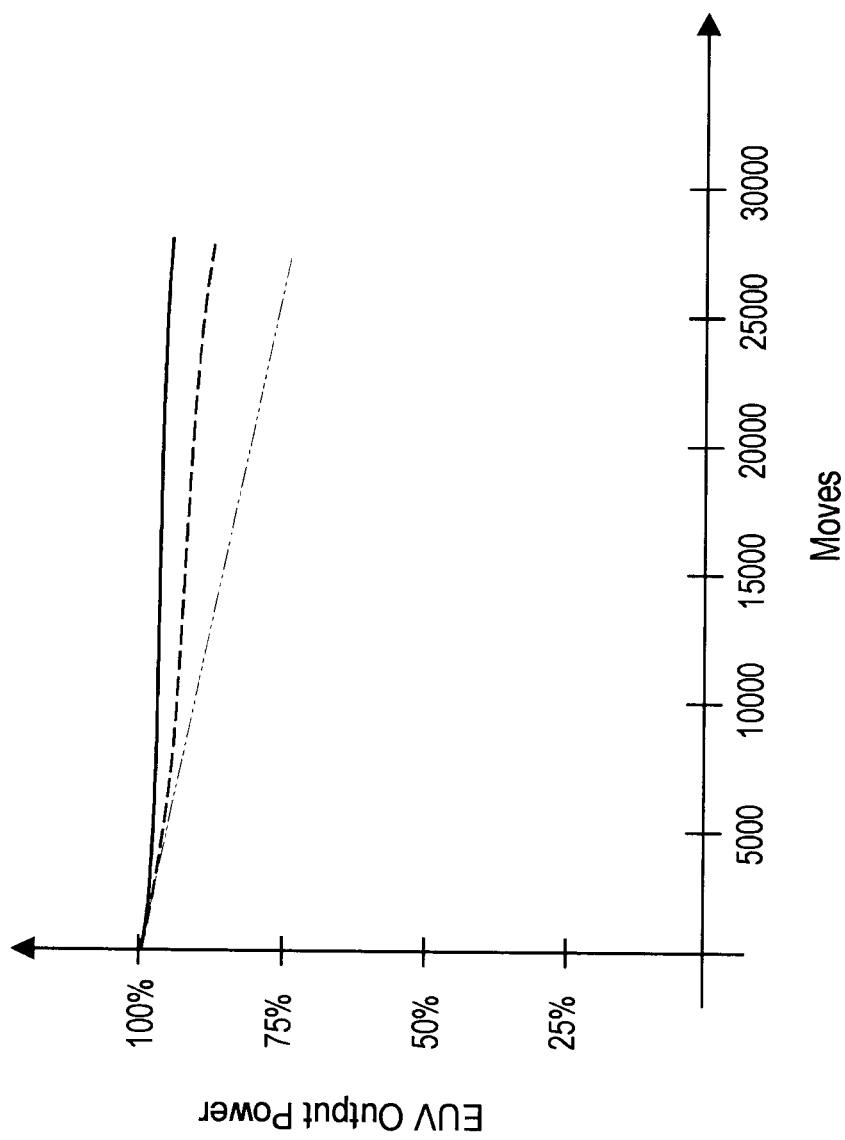

FIG. 3G is a diagram that illustrates loss of output power of light incident on the semiconductor wafer 220 relative to number of moves of the mask assembly 200 during processing of wafers. For example, output power of the light source 120 may be about 250 Watts, and after 20,000 moves of the mask assembly 200, due to accumulation of particles on the pellicle 370, effective output power may be reduced by about 5% to about 238 Watts. As shown in FIG. 3G, decay of the pellicle 370 may vary significantly from pellicle to pellicle, batch to batch, lot to lot, or the like, which may increase difficulty in estimating output power and controlling for (e.g., compensating for) the reduction in output power relative to number of moves. For example, if decay of the output power over the lifetime of the pellicle 370 were well known, exposure time could be increased based on the decay relative to the number of moves.

Figure 4:
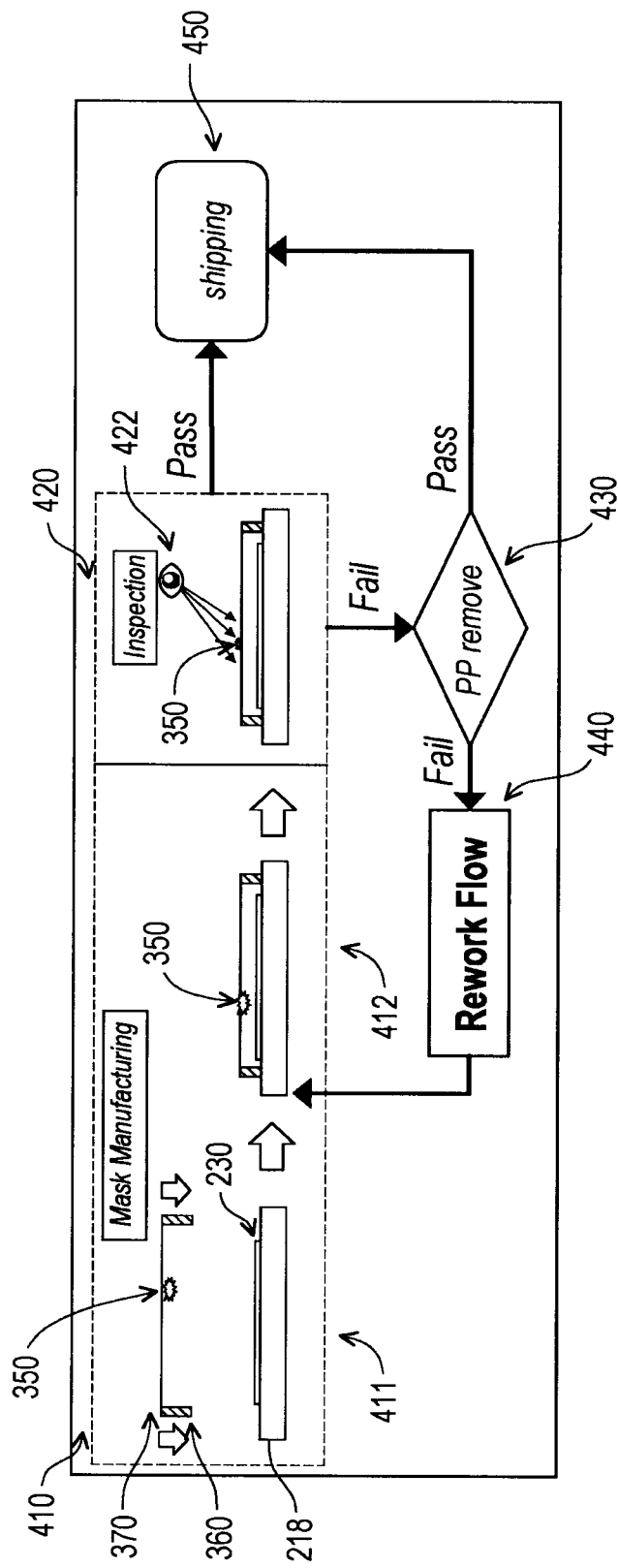
FIG. 4 is a view depicting a process for attaching a pellicle to a mask assembly in accordance with various embodiments.

FIG. 4 depicts a method of attaching a pellicle to a mask assembly in accordance with various embodiments. The method of FIG. 4 is described to provide context for the processes described with reference to FIGS. 6A-7.

In operation 410, a mask assembly having a pellicle assembly thereon is formed. Operation 410 includes operations 411 and 412. The mask assembly in operation 410 may be an embodiment of the mask assembly 200, may be similar or the same as the mask assembly 200, and is described using the same reference numerals as used above. In operation 411, mask 218 having mask pattern 230 thereon and a pellicle assembly including frame 360 and pellicle 370 are provided. Pellicle 370 may have one or more particles 350 thereon. For example, as depicted in operation 411, a particle 350 is on an inner surface of pellicle 370. In operation 412 the pellicle assembly is mounted or mated to the mask assembly, as shown.

After forming the mask assembly with the pellicle assembly thereon in operation 410, the mask assembly with the pellicle assembly thereon is inspected in operation 420. An optical inspection device is used in operation 420 to detect presence of particle(s) 350 on inner and/or outer surfaces of the pellicle 370. When number and size of particle(s) on the pellicle 370 does not exceed a selected threshold value, the process proceeds from operation 420 to operation 450, in which the mask assembly with the pellicle assembly thereon is sent on for use in a lithography system, such as the lithography system 10 described with reference to FIGS. 1A and 1B. When number and size of particle(s) on the pellicle 370 exceeds the selected threshold value, the process proceeds from operation 420 to operation 430, in which particle removal is attempted.

Operation 430 follows operation 420 when particle(s) having size and/or number greater than a selected threshold value are detected on pellicle 370. In operation 430, removal of the particle(s) from the pellicle 370 is attempted. If removal of the particle(s) is successful, the mask assembly having the pellicle assembly thereon passes, and may be sent on for use in a lithography system, such as the lithography system 10, in operation 450. When removal of the particle(s) is unsuccessful or insufficiently successful, the process proceeds from operation 430 to operation 440, in which the mask assembly having the pellicle assembly thereon enters a rework flow.

Operation 440 follows operation 430 when removal of particle(s) from the pellicle 370 fails. In the rework flow, the pellicle frame and the pellicle may be demounted from the mask assembly, and a second cleaning operation may be performed on the pellicle. In some embodiments, the pellicle is replaced with a new pellicle by removing the pellicle and attaching the new pellicle to the frame.

Following operation 440, the process proceeds to operation 412, in which the pellicle assembly is mounted to the mask assembly as described previously.

The process depicted in FIG. 4 is beneficial to sent out the mask assembly with the pellicle assembly attached thereto with few or no particles thereon. A detailed process 701 that is illustrated in FIG. 7 includes one or more optical sensors installed in the mounter to expedite detection of particles on the pellicle, the mask, or both. In the detailed process 701, particles may be detected prior to mounting the pellicle assembly to the mask assembly, which may be beneficial to reducing or eliminating rework in the rework flow of operation 440. FIGS. 6A-6F illustrate operations of the process 701. The following description of FIGS. 5A-5D provides context for the structural elements and process operations in which the process 701 may be performed.

Figure 5A:
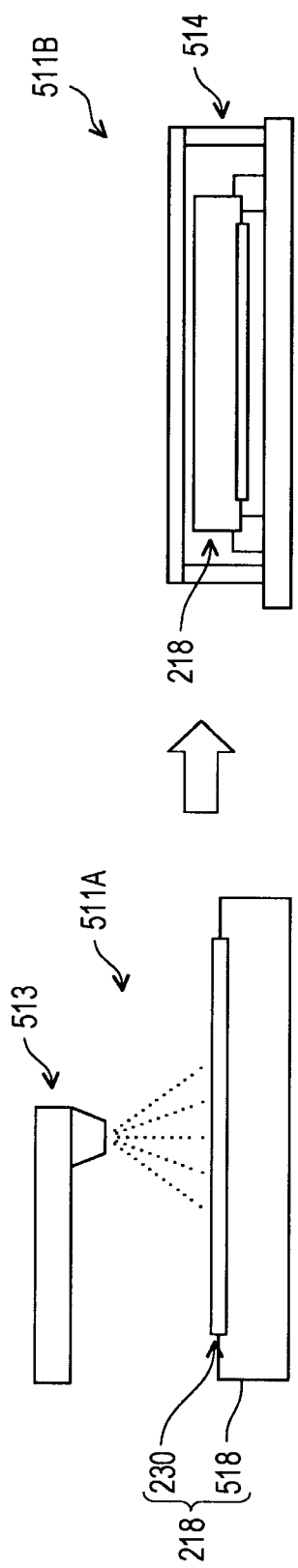
FIGS. 5A-5D are views depicting a process for attaching a pellicle to a mask assembly according to various aspects of the present disclosure.

FIG. 5A depicts operations 511A, 511B for forming mask pattern 230 on mask 218 (operation 511A) and storing the mask 218 in a standard mechanical interface (SMIF) pod 514 (operation 511B) in accordance with various embodiments. A number of operations may be performed in operation 511A when making a mask for EUV lithography, such as the mask 218. Forming the EUV mask may initially include providing a blank substrate 518 made of fused silica or another suitable material. The substrate 518 may be polished to be very flat and clean, which is beneficial for achieving accuracy and resolution in the final mask. An absorber or metal layer 230 may be deposited as a thin layer of metal (e.g., molybdenum) on the substrate 518. The metal layer 230 absorbs EUV light and forms a pattern that may be transferred to a wafer during semiconductor processing. After the absorber layer 230 is deposited, a layer of photoresist (not depicted) is coated onto the surface thereof. The photoresist layer is then exposed to a pattern of light, which causes the photoresist to become either more or less soluble in certain areas. The photoresist is developed, which removes the soluble regions, leaving a patterned layer of photoresist on top of the absorber layer. The patterned photoresist layer may be used as a mask for etching the absorber layer. Exposed areas of the absorber layer are selectively removed using, for example, a plasma etcher 513, which leaves behind the desired pattern. The patterned metal layer 230 is also referred to as the "mask pattern" 230. The substrate 518 and the mask pattern 230 may be referred to collectively as the mask 218.

In operation 511B, following formation of the mask pattern 230 in operation 511A, the mask 218 is positioned in the SMIF pod 514, as shown. Prior to positioning the mask 218 in the SMIF pod 514, the mask may be cleaned by a cleaner or cleaning apparatus (not depicted).

Figure 5B:
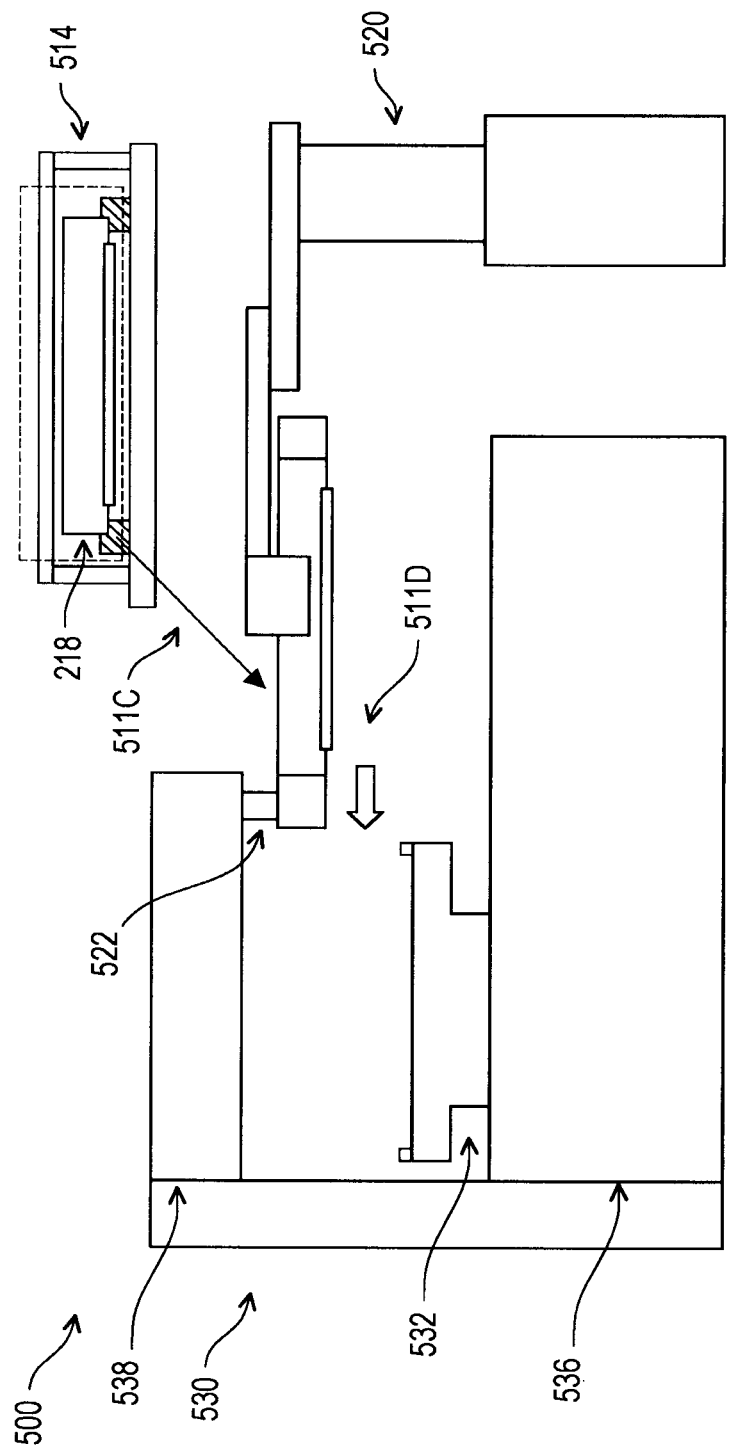

FIG. 5B illustrates an operation 511C and an operation 511D. Operation 511C follows operation 511B. Following positioning the mask 218 in the SMIF pod 514 in operation 511B, the SMIF pod 514 is transferred to a mounter or mounting apparatus 530, and the mask 218 is transferred from the SMIF pod 514 to a mask stage 522. The mask stage 522 is an embodiment of mask stage 16 and mask stage 216 and may be similar in many respects thereto. The mask 218 is mounted to the mask stage 522 in operation 511C, for example, by a robot 520, which may be or include a robot arm 520. The robot 520 may remove the mask 218 from the SMIF pod 514 and may position the mask 218 on the mask stage 522, after which the robot 520 may release the mask 218. The mask stage 522 may be positioned at a top portion 538 of the mounting apparatus 530 and the pellicle stage 532 may be positioned at a bottom portion 536 of the mounting apparatus 530.

Operation 511D follows operation 511C. After the mask 218 is positioned on the mask stage 522, the mask stage 522 may move in the mounter 530 to a mask mount or mask mate position (see FIG. 5C) as depicted by an arrow in FIG. 5B. The mount position may be aligned with a pellicle mount or pellicle mate position of pellicle stage 532.

Figure 5C:
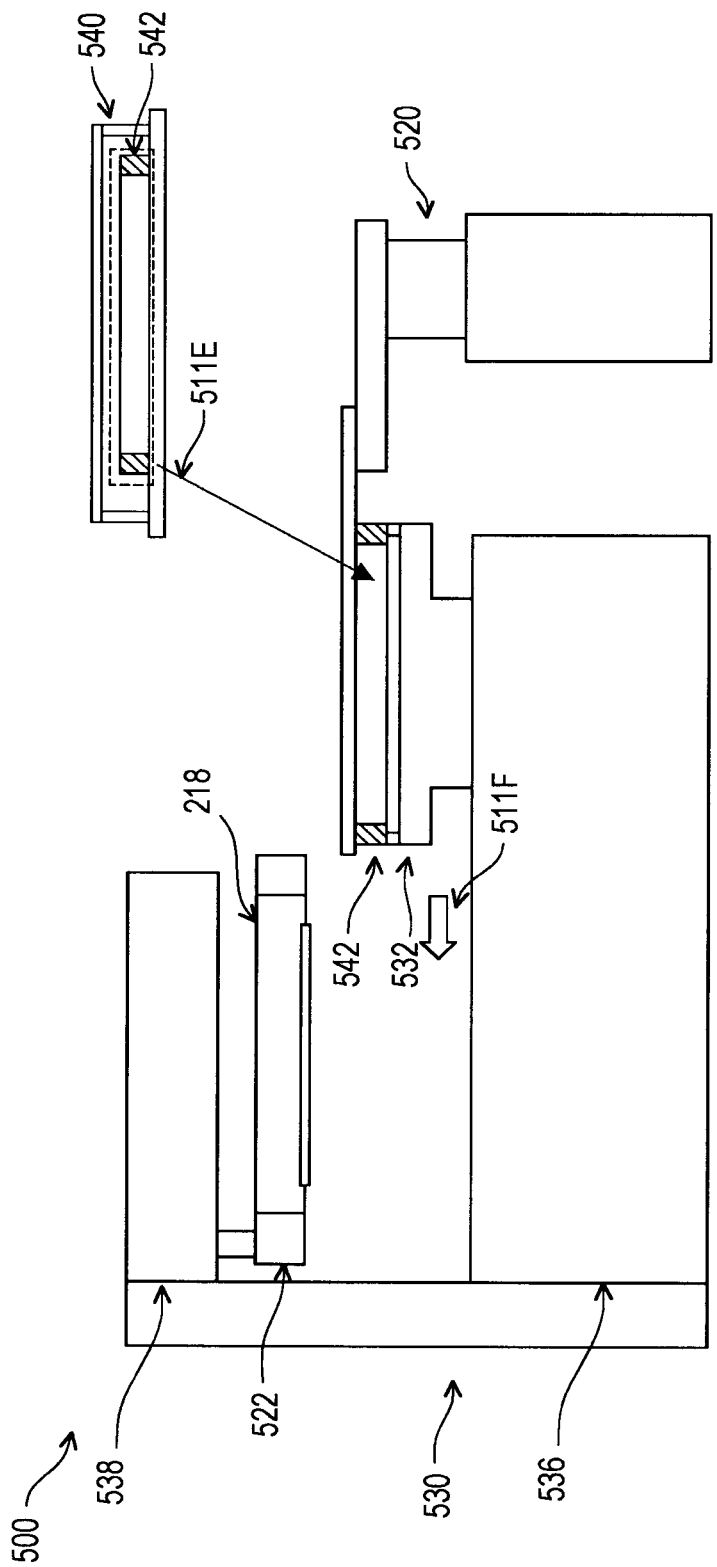

FIG. 5C depicts operations 511E and 511F. Operation 511E follows operation 511D. Following moving the mask stage 522 to the mask mount position in operation 511D, pellicle assembly 542 including a pellicle mounted on a frame as described previously is transferred from a pellicle box 540 to the pellicle stage 532. Operation 511E may be performed by robot 520. For example, the robot 520 may grip the pellicle box 540, open a cover of the pellicle box 540, remove the pellicle assembly 542 from the pellicle box 540 and place the pellicle assembly 542 on the pellicle stage 532.

Operation 511F follows operation 511E. Following transferring the pellicle assembly 542 from the pellicle box 540 to the pellicle stage 542 in operation 511E, the pellicle stage 542 may move under the mask stage to a pellicle mount or pellicle mate position (see FIG. 5D) in operation 511F, as depicted by an arrow in FIG. 5C.

Figure 5D:
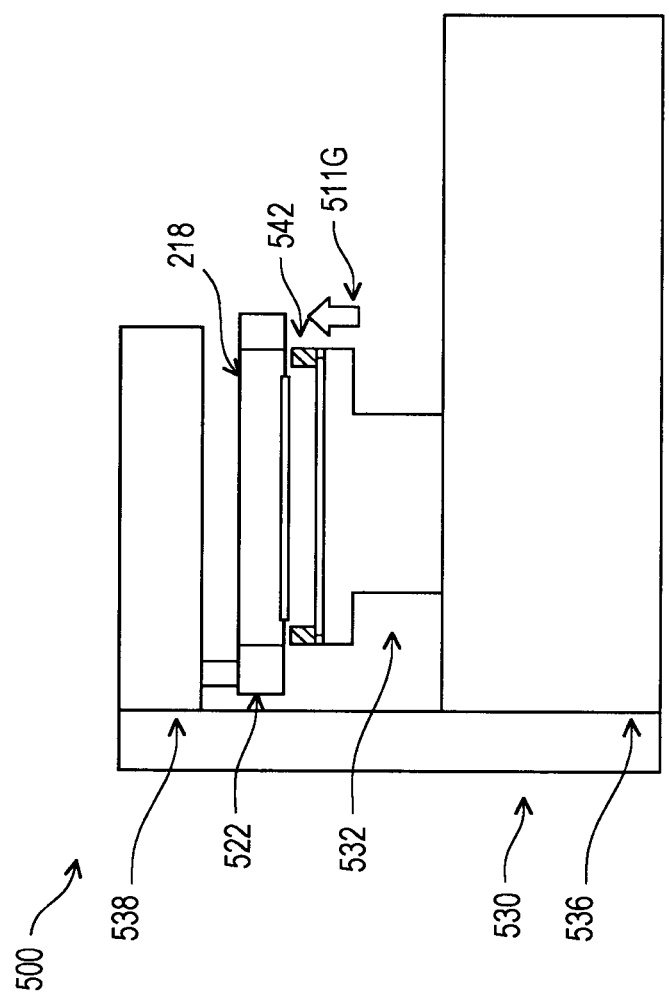

FIG. 5D depicts operation 511G, which follows operation 511F. In operation 511G, the pellicle stage 532 rises slowly until the pellicle assembly 542 is mounted to the mask 218.

In the process described with reference to FIGS. 5A-5D, each of the operations 511A-511G may induce particles on the mask 218 or inside the pellicle membrane. FIGS. 6A-6F and FIG. 7 depict a process 701 that detects particle(s) on the pellicle assembly 542 or the mask 218 prior to mounting the pellicle assembly 542 to the mask 218 (e.g., prior to operation 511G of FIG. 5D). One or more in-situ surface scans detect particle(s) and verify mask quality prior to mounting the pellicle assembly 542 to the mask 218, for example, by detecting whether a defect level (e.g., number of defects) of the pellicle assembly 542 and/or the mask 218 is less than a selected value. The process 701 may prevent presence of fall-on particles inside the pellicle assembly 542 or on a surface of the mask 218 after mounting of the pellicle assembly 542 to the mask 218.

FIG. 7 is a flowchart of a process or method 701 for forming a device in accordance with various embodiments. In some embodiments, the process 701 for forming the device includes a number of operations (700, 710, 720, 722, 724, 730, 740, 750, 760, 762, 764, 770, 772, 774 and 780). The process 701 for forming the device will be further described according to one or more embodiments. It should be noted that the operations of the process 701 may be rearranged or otherwise modified within the scope of the various aspects. It should further be noted that additional processes may be provided before, during, and after the process 701, and that some other processes may be only briefly described herein. In some embodiments, the process 701 is performed by the mounting system 500 described with reference to FIGS. 6A-6F. The embodiments are described with reference to the structural elements and processes described in FIGS. 6A-6F and FIGS. 5A-5D, but the process 701 may be performed by a mounting system having one or more structural elements that are different from those of the mounting system 500. It should be understood that operation 780 of performing semiconductor processing using the mask assembly may be performed by the lithography exposure system 10 described with reference to FIGS. 1A and 1B. Process 701 may be performed by one or more processors executing computer instructions. In some embodiments, process 701 is performed by specifically designed hardware. In some embodiments, process 701 is performed by a combination of hardware and software.

The method 701 begins at operation 700 and proceeds to operation 710 in which a mask is attached to a mask stage. The mask may be attached to the mask stage in a manner similar to that described for operation 511C of FIG. 5B. In FIG. 6A, the mask 218 is shown already attached to the mask stage 522.

Operation 720 follows operation 710. After the mask is attached to the mask stage in operation 710, the mask stage is moved toward a mask mounting position in operation 720, as indicated by an arrow in FIG. 6A and as is indicated by an arrow in FIG. 6B. The mask mounting position may be similar to that described with reference to operation 511D of FIG. 5B.

Operation 722 follows operation 720. In operation 722, it is determined whether the mask stage has reached the mask mounting position. When the mask stage has not yet reached the mask mounting position, the method 701 proceeds from operation 722 to operation 724, in which the mask is scanned by a first optical detector (e.g., a first interferometer).

A first optical detector 600 is depicted in FIGS. 6A and 6B. In some embodiments, the first optical detector 600 is an interferometer. For example, the first optical detector 600 may be a Spectral Domain Optical Coherence Tomography (SD-OCT) imaging apparatus. An embodiment of the SD-OCT imaging apparatus 600 is depicted in FIG. 6E and described in greater detail later with reference thereto.

The first optical detector 600 may be mounted to a side of the pellicle stage 532, as shown in FIG. 6A. The side may be a side that is distal the pellicle mounting position, as shown in FIG. 6A. In some embodiments, the side is a side that is proximal the pellicle mounting position. The first optical detector 600 may face upward toward the mask stage 522, as depicted in FIGS. 6A and 6B. As such, light for scanning the mask pattern 230 that exits the first optical detector 600 may be incident on the mask pattern 230 as the mask stage 522 passes over the first optical detector 600 on the way to the mask mounting position.

In some embodiments, the light is elongated along an axis. For example, the mask stage 522 may move in a first direction toward the mask mounting position, as indicated by the arrow in FIG. 6B. The light may be elongated along a second direction perpendicular the first direction. Width of the light along the second direction may be substantially the same as width of the mask patterns 230 along the second direction.

In some embodiments, the light has width in the second direction that is much less than the width of the mask patterns 230 along the second direction. As such, the light exiting the first optical detector 600 may scan back and forth along the second direction to cover substantially the entire width of the mask patterns 230 as the mask stage 522 moves toward the mask mounting position.

The first optical detector 600 captures one or more images at different depths. It should be understood that "depth" refers to a third direction that is perpendicular to the first and second directions described herein. The different depths when scanning the mask 218 may refer to depths that are at or above the surface of the mask 218 at which the mask patterns 230 are positioned. Namely, the first optical detector 600 may not need to capture images under the mask patterns 230, as particles are generally not present behind the mask patterns 230, but instead are present on top of the mask patterns 230, on the surface facing the first optical detector 600.

The images may be combined to determine whether the mask 218 passes or fails inspection. For example, the mask 218 may pass inspection when no particle is detected on the mask 218 or when a number and/or size of particles (or "defect level") on the mask 218 does not exceed (e.g., is less than) a mask particle threshold value (or "selected value"). In some embodiments, the mask particle threshold value is zero, corresponding to no particles being detected on the mask 218. It should be understood that particles below a selected size may not be detected by combining the images captured by the first optical detector 600. As such, the mask 218 may not be free of particles, but may be free of particles over the selected size. For example, the selected size may be having major diameter greater than 200 nm, greater than 300 nm or greater than another suitable dimension.

Operations 720, 722 and 724 may be repeated until the mask stage 522 reaches the mask mounting position. In some embodiments, operation 724 may be performed only while the mask 218 is directly over the first optical detector 600 and may not be performed after the mask 218 has been completely scanned and the mask stage 522 is still moving toward the mask mounting position. When it is determined that the mask stage 522 has reached the mask mounting position, the process 701 moves from operation 722 to operation 730.

Operations 720, 722 and 724 are described as embodiments in which the first optical detector 600 scans the mask 218 as the mask stage 522 moves toward the mask mounting position, which is depicted in FIG. 6A. Namely, the first optical detector 600 is stationary while capturing images of the mask 218 as the mask stage 522 moves toward the mask mounting position. And, the pellicle assembly 542 is not present on the pellicle stage 532 while the images are captured by the first optical detector 600.

In some other embodiments, a first optical detector 600A may be positioned on a side of the pellicle stage 532 that is proximal the pellicle mounting position, namely the opposite side of that shown in FIG. 6A. In such embodiments, the first optical detector 600A may be in motion while capturing images of the mask 218 on the mask stage 522 that is stationary at the mask mounting position. Namely, the first optical detector 600A may scan the mask 218 while the pellicle stage 532 moves toward the pellicle mounting position. And, the pellicle assembly 542 is present on the pellicle stage 532 while the images are captured by the first optical detector 600A.

In some further embodiments, first optical detectors 600, 600A are positioned on both sides (distal and proximal) of the pellicle stage 532. In such embodiments, the first optical detector 600 on the distal side may scan the mask 218 while the mask stage 522 moves toward the mask mounting position and the first optical detector 600A on the proximal side may scan the mask 218 while the pellicle stage 532 moves toward the pellicle mounting position. Results of the two scans by the first optical detectors 600, 600A on either side of the pellicle stage 532 may be compared or merged to determine count, size and location of particle(s) on the mask 218.

Operation 730 follows operation 722 when the mask stage 522 has reached the mask mounting position. In operation 730, it is determined whether the mask 218 passes inspection. When the mask 218 fails as determined based on the images captured by the first optical detector 600, the process 701 proceeds from operation 730 to operation 740. When the mask 218 passes as determined based on the images captured by the first optical detector 600, the process 701 proceeds from operation 730 to operation 750.

Operation 740 follows operation 730 in response to determining that the mask 218 does not pass inspection. In operation 740, the mask 218 is cleaned. Cleaning the mask 218 may include backing the mask stage 522 away from the mask mounting position to a position accessible by the robot 520, removing the mask 218 from the mask stage 522, placing the mask 218 in the SMIF pod 514, transporting the mask 218 to a cleaning apparatus (not depicted), transferring the mask 218 from the SMIF pod 514 to the cleaning apparatus and cleaning the mask 218 to remove particle(s) therefrom. After the mask 218 has been cleaned, the mask 218 is reattached to the mask stage 522 by returning to operation 710 from operation 740.

Operation 750 follows operation 730 in response to determining that the mask 218 does pass inspection. In operation 750, a pellicle assembly including a pellicle is attached to a pellicle stage. For example, the pellicle assembly 542 is attached to the pellicle stage 532 in FIG. 6C. Operation 750 may be similar in many respects to operation 511E of FIG. 5C.

Operation 760 follows operation 750. After the pellicle assembly 542 is attached to the pellicle stage 532 in operation 750, the pellicle stage 532 moves toward the pellicle mounting position, as indicated by arrows in FIGS. 6C and 6D.

Operation 762 follows operation 760. In operation 762, a determination is made whether the pellicle stage has reached the pellicle mounting position. In response to the pellicle stage not having reached the pellicle mounting position, the process 701 proceeds from operation 762 to operation 764. In response to the pellicle stage having reached the pellicle mounting position, the process 701 proceeds from operation 762 to operation 770.

Operation 764 follows operation 762. In operation 764, in response to determining that the pellicle stage has not reached the pellicle mounting position, or simply while the pellicle stage is moving toward the pellicle mounting position, the pellicle of the pellicle assembly 542 is scanned by a second optical detector 602. The second optical detector 602 may be similar in many respects to the first optical detector 600 and/or the first optical detector 600A. The scanning by the second optical detector 602 may be similar in many respects to that described with reference to operation 724, with a difference being that the scanning may be at depths that are on both sides of the pellicle. Namely, the pellicle may have particles on the side facing toward the mask 218 and on the side facing away from the mask 218, as described with reference to FIG. 3D. As such, the images may be captured by the second optical detector 602 at depths above the pellicle and below the pellicle.

Figures 6C, 6D:
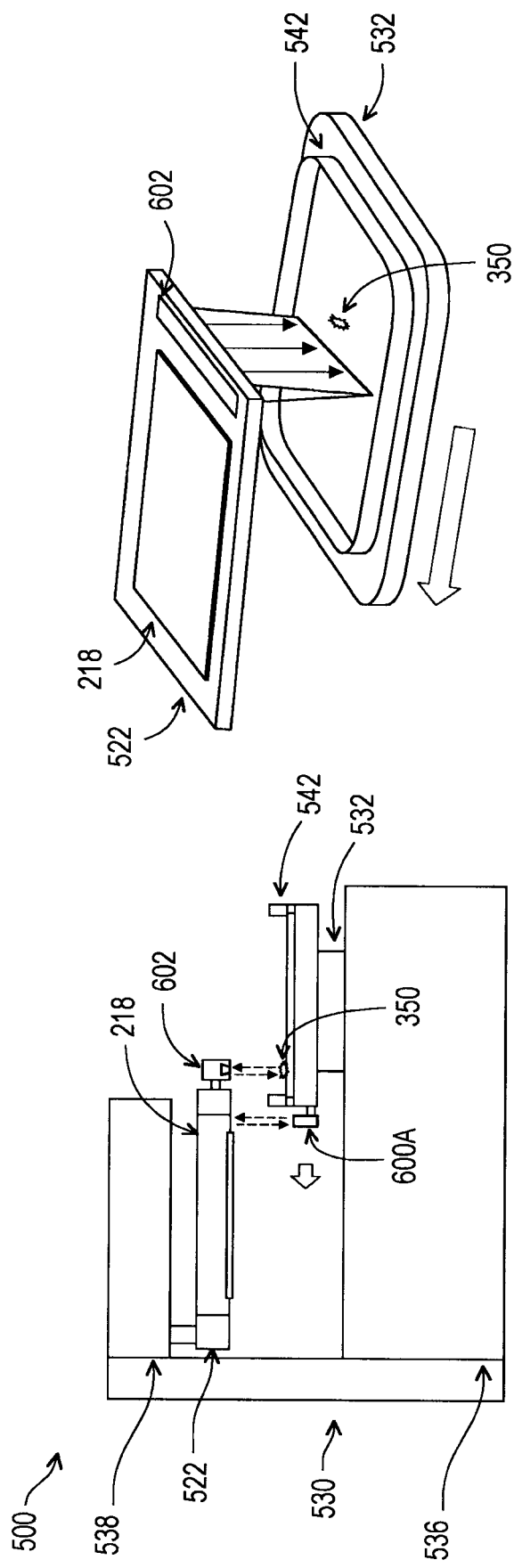
Figure 6E:
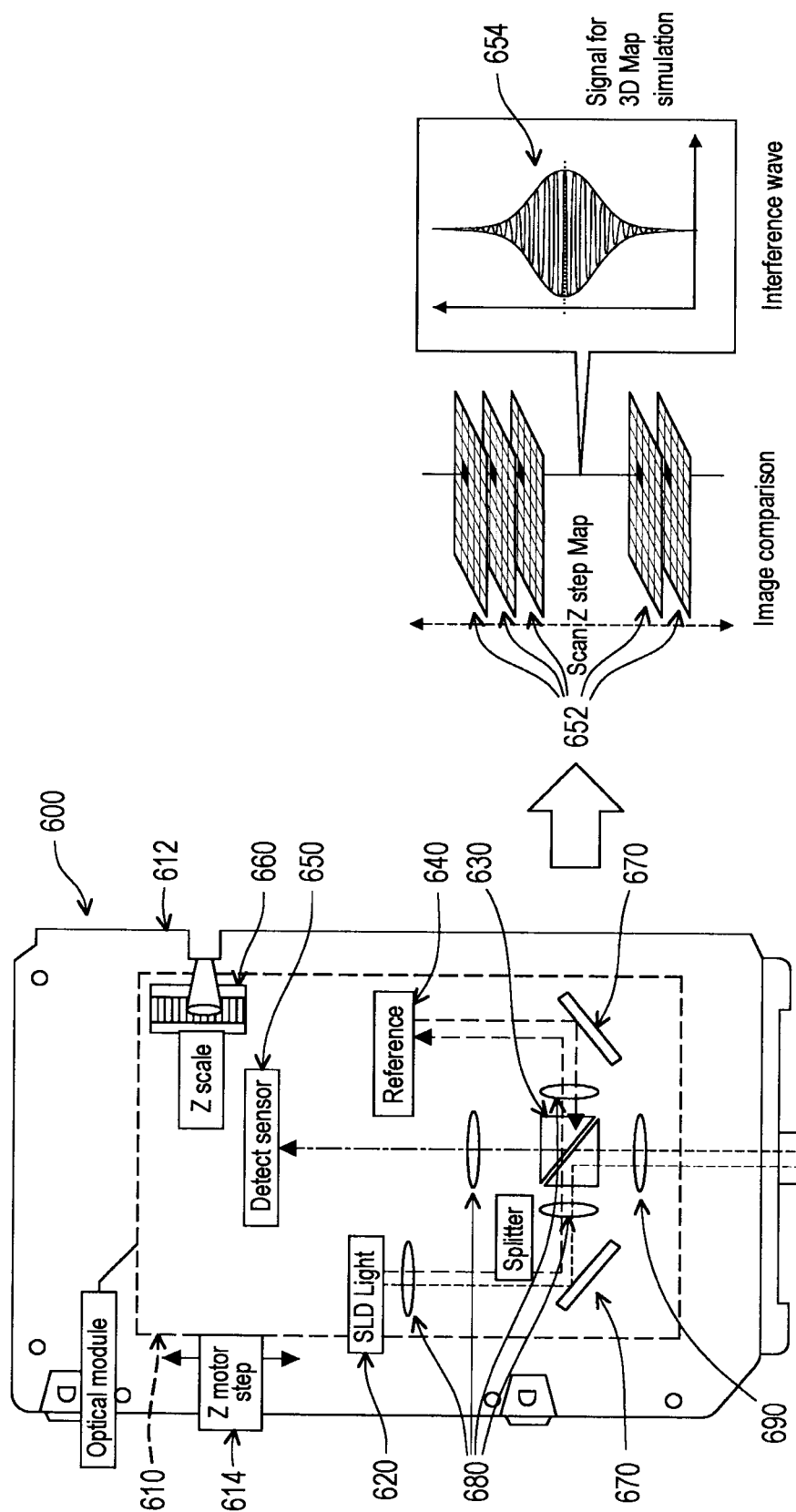
Figure 7:
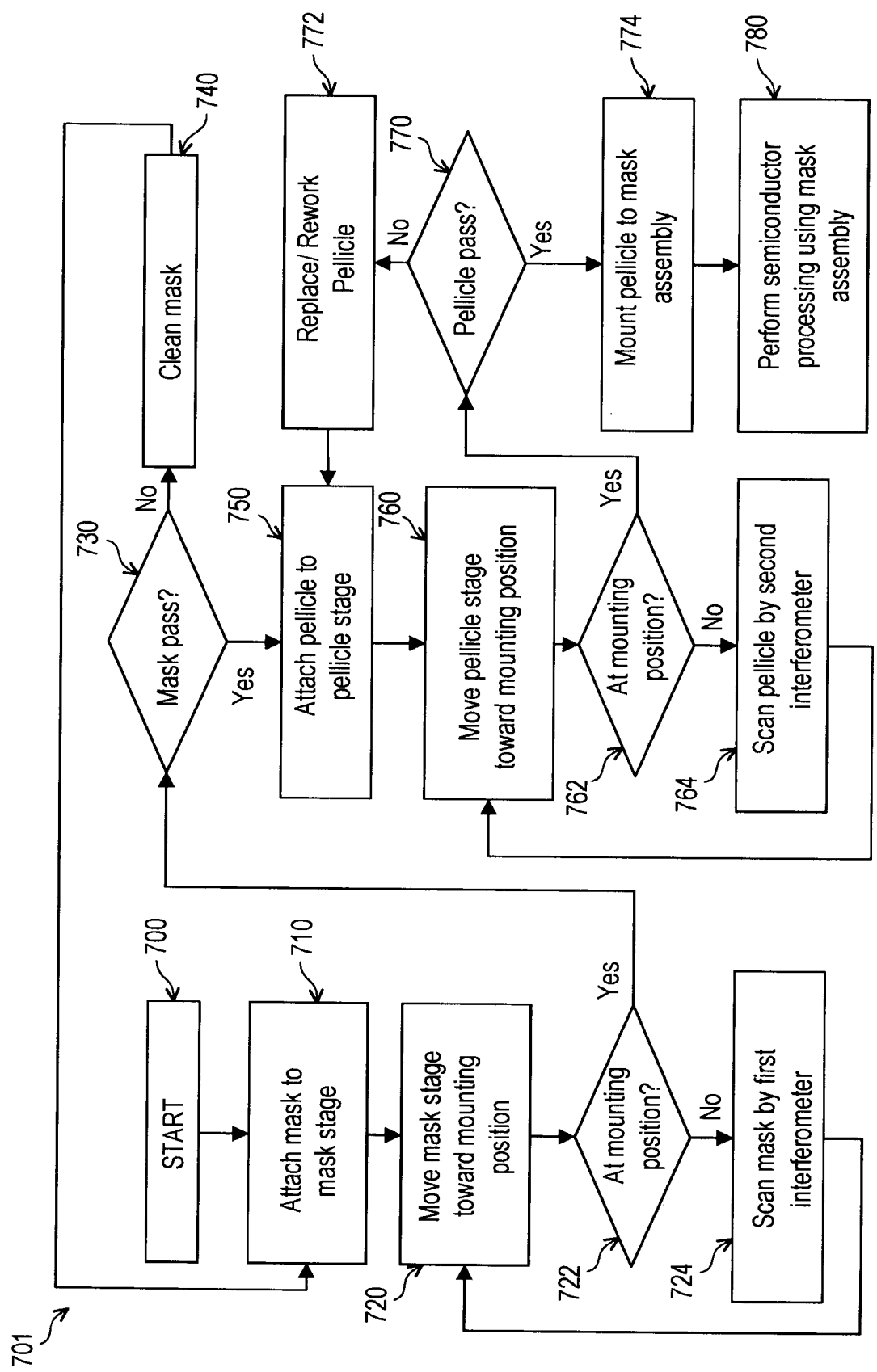
FIG. 7 is a flowchart of a process for performing semiconductor processing using a mask assembly having a pellicle attached thereto in accordance with various embodiments.

The second optical detector 602 may be mounted to a side of the mask stage 522, as shown in FIG. 6C. The side may be a side that is distal the mask mounting position, as shown in FIG. 6C. The first optical detector 600 may face downward toward the pellicle stage 532, as depicted in FIGS. 6C and 6D. As such, light for scanning the pellicle that exits the second optical detector 602 may be incident on the pellicle as the pellicle stage 532 passes under the second optical detector 602 on the way to the pellicle mounting position. Because the mask 218 is typically positioned in the mounting apparatus 530 prior to the pellicle assembly 542, another second optical detector 602 is generally not mounted to the proximal side of the mask stage 522, as the pellicle is not present while the mask stage 522 moves to the mask mounting position.

The images may be combined to determine whether the pellicle passes or fails inspection. For example, the pellicle may pass inspection when no particle is detected on the pellicle or when a number and/or size of particles (or "defect level") on the pellicle does not exceed a pellicle particle threshold value (or "selected value"). In some embodiments, the pellicle particle threshold value is zero, corresponding to no particles being detected on the pellicle. It should be understood that particles below a selected size may not be detected by combining the images captured by the second optical detector 602. As such, the pellicle may not be free of particles, but may be free of particles over the selected size. For example, the selected size may be having major diameter greater than 200 nm, greater than 300 nm or greater than another suitable dimension. In some embodiments, the pellicle may pass inspection when no particle is detected on the inner side of the pellicle that faces toward the mask 218. Namely, the pellicle may pass even if one or more particles is detected on the outer side of the pellicle that faces away from the mask 218.

Operation 770 follows operation 762 when the pellicle stage 532 has reached the pellicle mounting position. In operation 770, it is determined whether the pellicle passes inspection. When the pellicle fails as determined based on the images captured by the second optical detector 602, the process 701 proceeds from operation 770 to operation 772. When the pellicle passes as determined based on the images captured by the second optical detector 602, the process 701 proceeds from operation 770 to operation 774.

Operation 772 follows operation 770 in response to the pellicle failing inspection. In operation 772, the pellicle is replaced or reworked. For example, the pellicle may be cleaned by backing the pellicle assembly away from the pellicle mounting position, transferring the pellicle assembly to the pellicle box, transporting the pellicle assembly or the pellicle to a cleaning apparatus, cleaning the pellicle, and optionally remounting the pellicle to the frame. In some cases, the pellicle is replaced with a new pellicle. For example, the cleaning of the pellicle may fail to remove a sufficient number of particles from the pellicle. In another example, the pellicle may be damaged prior to or during cleaning. As such, the new pellicle may be mounted to the frame instead of the pellicle that had the particles thereon. After replacing or successfully reworking the pellicle, the pellicle assembly is reattached to the pellicle stage in operation 750.

Operation 774 follows operation 770 in response to the pellicle passing inspection. In operation 774, the pellicle assembly is mounted to the mask assembly. Mounting the pellicle assembly to the mask assembly may include a number of operations. A layer of adhesive may be applied to edges of the mask assembly where the pellicle assembly will be attached. The adhesive may be a UV-cured adhesive that is beneficial to forming tight bond between the mask assembly and pellicle assembly surfaces. Pressure may be applied to the edges of the pellicle assembly that is beneficial for the pellicle assembly to adhere tightly to the mask assembly. The pressure may be applied using a vacuum chuck (e.g., the pellicle stage 532) that holds the pellicle assembly in place while the pressure is applied. After the pellicle assembly is attached to the mask assembly, the adhesive may be cured using a UV light source, causing the adhesive to harden and bond tightly to the mask assembly and pellicle assembly surfaces.

Operation 780 follows operation 774. After mounting the pellicle assembly to the mask assembly, the mask assembly having the pellicle assembly mounted thereto (or simply "protected mask assembly") is used to perform one or more semiconductor processes. For example, the protected mask assembly may be installed in a lithography system (e.g., the lithography system 10), light may be reflected as patterned light from the mask 218, and the patterned light may be directed to a photoresist layer on a semiconductor wafer. The photoresist layer is exposed to a pattern of the patterned light, which causes the photoresist to become either more or less soluble in certain areas. The photoresist is developed, which removes the soluble regions, leaving a patterned layer of photoresist on top of the underlying layer. The patterned photoresist layer may be used as a mask for etching the underlying layer. Exposed areas of the underlying layer are selectively removed using, for example, a plasma etcher, atomic layer etcher, or other suitable etcher, which leaves behind the desired pattern.

The process 701 may be modified in a variety of ways to form different embodiments. For example, operation 724 may be optional. Namely, the process 701 may only scan the pellicle. In another example, operation 764 may be optional. Namely, the process 701 may only scan the mask.

FIG. 6E depicts an embodiment of the first optical detector 600. The first optical detector 600 depicted in FIG. 6E may also be an embodiment of the first optical detector 600A, the second optical detector 602 or both.

The first optical detector 600 may include an optical module 610 positioned in a housing 612. The first optical detector 600 may include at least one motor that is operable to step the optical module 610 in the third axis direction, which may be a Z-axis direction or depth direction.

The optical module 610 includes light source 620. The light source 620 may be or include one or more superluminescent diodes (SLDs) that emit near-infrared light.

The optical module 610 includes a splitter or interferometer 630. The interferometer 630 splits the light into two beams, one that goes directly to the surface being imaged (e.g., the mask 218 or the pellicle), and the other that reflects off a reference mirror 640. By measuring the difference in time it takes for the two beams to reach a detection sensor 650, the optical module 610 can determine the depth of each point on the surface.

The optical module 610 includes one or more mirrors 670 that direct the light to and from the light source 620, the splitter 630 and the reference mirror 640.

The optical module 610 includes lenses 680 along optical paths between the light source 620, the splitter 630, the reference mirror 640 and the detection sensor 650. The optical module 610 further includes an object lens 690 that is positioned between the splitter 630 and the surface being imaged.

In FIG. 6E, the optical module 610 may generate one or more images 652. Each of the images 652 may be captured at a different depth. With different Z-axis depths, a three-dimensional (3D) Z-axis interference wave map 654 may be generated, and particle(s) may be found using a gating rule or algorithm.

Figure 6F:
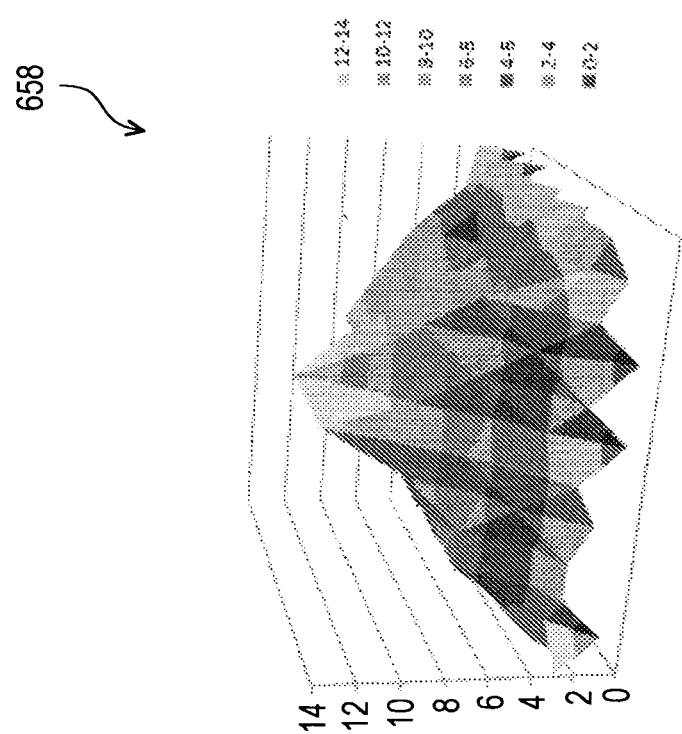
Figure 6F:
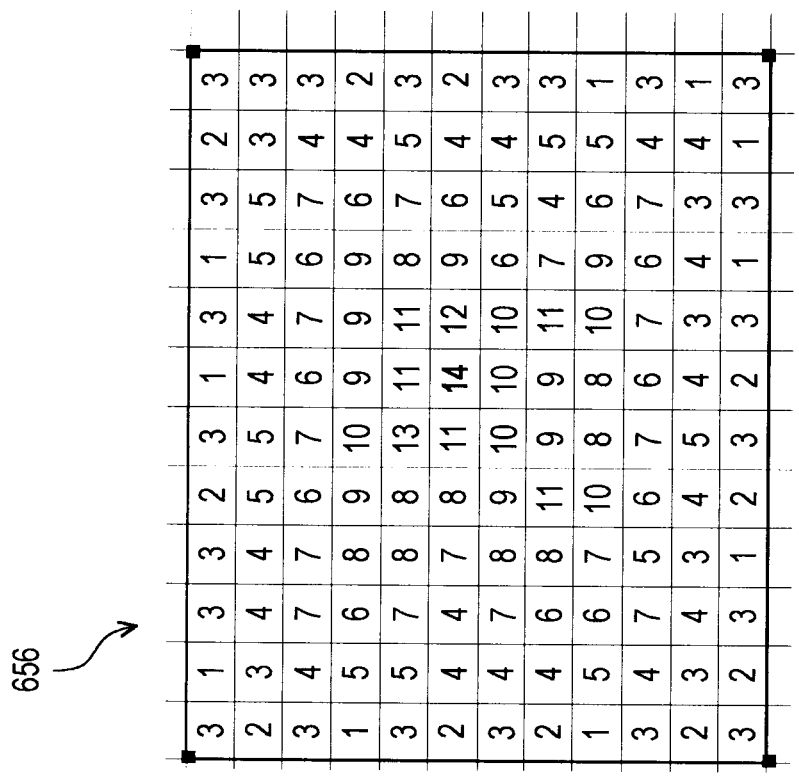

FIG. 6F depicts partial interference wave maps 656, 658 that are generated by comparing or merging the images 652 of FIG. 6E. The wave map 658 is a visual graph of the wave map 656, which is a numerical representation of depths at each respective region of the surface that was imaged. The partial interference wave maps 656, 658 depicted in FIG. 6F may correspond to a region having a particle thereon.

During stage movement, the optical module 610 may scan a variety of ranges of the pellicle membrane with various Z steps, and may thereby identify particles, including particle sizes, particle positions and whether each particle is on the inner or outer surface of the pellicle membrane.

Figure 8:
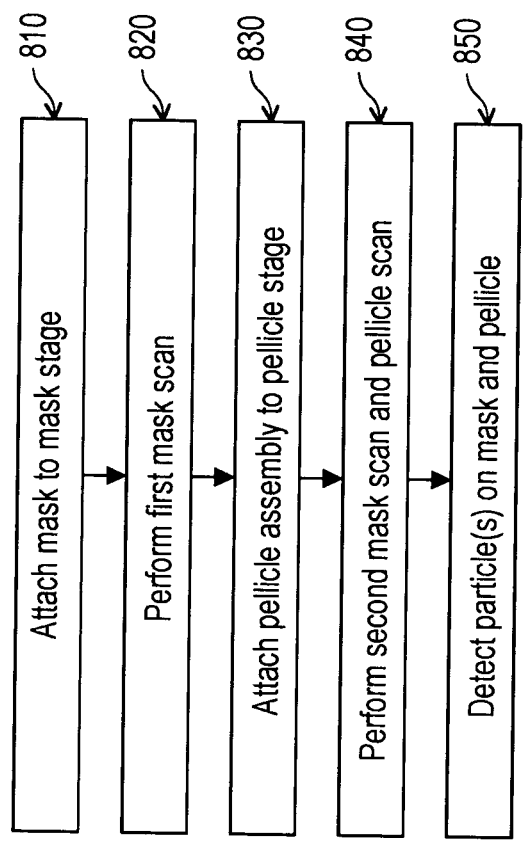
FIG. 8 is a flowchart of a process for scanning a mask and a pellicle prior to mounting in accordance with various embodiments.

FIG. 8 is a flowchart of a process 801 for scanning a mask and a pellicle prior to mounting in accordance with various embodiments. The process 801 may be utilized when the two first optical detectors 600, 600A and the second optical detector 602 are present.

In operation 810, a mask is attached to a mask stage, which may be similar in many respects to operation 710 of FIG. 7.

Operation 820 follows operation 810. In operation 820, a first mask scan is performed. During the first mask scan, the pellicle stage is in the pellicle mounting position, and the first optical detector 600 scans the mask 218 as the mask stage 522 moves toward the mask mounting position. Operation 820 is similar in many respects to operation 724 of FIG. 7.

Operation 830 follows operation 820. Following the first mask scan being performed, a pellicle assembly is attached or mounted to a pellicle stage in operation 820, which is similar in many respects to operation 750 of FIG. 7.

Operation 840 follows operation 830. Following the first mask scan and attaching the pellicle assembly to the pellicle stage, a second mask scan and a pellicle scan are performed in operation 840. The second mask scan and the pellicle scan may be performed simultaneously as the pellicle stage moves toward the pellicle mounting position. For example, the first optical detector 600A may scan the mask 218 while the second optical detector 602 scans the pellicle.

Operation 850 follows operation 840. In operation 850, presence of particles is detected on the mask and the pellicle, which may be similar in many respects to operations 730 and 770 of FIG. 7, respectively. In the process 801, the detection of particles on the pellicle does not have to follow after or be dependent on the detection of particles on the mask. Instead, the detection of particles on the pellicle may be performed simultaneously with the detection of particles on the mask or may be performed prior to the detection of particles on the mask.

Embodiments may provide advantages. The methods 701, 801 of the embodiments detect particles 350 before the pellicle assembly is mounted to the mask assembly, which reduces rework and improves utilization.

In accordance with at least one embodiment, a method includes: placing a mask on a mask stage; placing a pellicle assembly on a pellicle stage, the pellicle assembly including a pellicle; determining whether a defect level of the pellicle is less than a selected value by scanning the pellicle by a first optical detector; forming a protected mask assembly by mounting the pellicle assembly to the mask assembly; and performing semiconductor processing using the protected mask assembly.

In accordance with at least one embodiment, an apparatus includes: a top portion; a mask stage positioned on the top portion; a bottom portion; a pellicle stage positioned on the bottom portion; and a second optical detector mounted to the mask stage, the second optical detector facing the pellicle stage.

In accordance with at least one embodiment, a method includes: placing a mask assembly on a mask stage in a mounting apparatus; placing a pellicle assembly on a pellicle stage in the mounting apparatus; generating a second plurality of images by scanning the pellicle assembly by a second interferometer positioned in the mounting apparatus; determining whether a number of particles on a pellicle of the pellicle assembly exceeds a threshold value; and in response to the number of particles not exceeding the threshold value: forming a protected mask assembly by mounting the pellicle assembly to the mask assembly; and performing semiconductor processing on a semiconductor wafer by using the protected mask assembly.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    placing a mask on a mask stage;
    placing a pellicle assembly on a pellicle stage, the pellicle assembly including a pellicle;
    determining whether a defect level of the pellicle is less than a selected value by scanning the pellicle by a first optical detector;
    scanning the mask by a second optical detector mounted on the pellicle stage;
    forming a protected mask assembly by mounting the pellicle assembly to the mask assembly; and
    performing semiconductor processing using the protected mask assembly.

2. The method of claim 1, wherein the scanning the pellicle includes scanning the pellicle by the first optical detector that is mounted on the mask stage.

3. The method of claim 1, wherein the scanning of the pellicle by the first optical detector comprises:
    capturing a plurality of images at different axial positions of the pellicle;
    combining, by one or more processors, the plurality of images to generate a three-dimensional interference wave map of the pellicle; and
    determining, by the one or more processors, from the wave map, particle size and position for at least one particle detected from the wave map.

4. The method of claim 1, further comprising capturing a plurality of images by the second optical detector at the same depth.

5. The method of claim 1, wherein the scanning the pellicle includes scanning the pellicle by the first optical detector while the pellicle assembly moves toward a pellicle mounting position.

6. The method of claim 5, wherein the first optical detector is stationary along at least two axes while the pellicle assembly moves toward the pellicle mounting position.

7. The method of claim 1, further comprising capturing a plurality of images by the first optical detector, at least one of the first plurality of images being captured at a different depth than another of the first plurality of images.

8. An apparatus, comprising:
    a top portion;
    a mask stage positioned on the top portion;
    a bottom portion;
    a pellicle stage positioned on the bottom portion;
    a first optical detector mounted to the pellicle stage, the first optical detector facing the mask stage; and
    a second optical detector mounted to the mask stage, the second optical detector facing the pellicle stage.

9. The apparatus of claim 8, wherein the second optical detector comprises an imaging objective sized to illuminate at least a full width of the pellicle while the pellicle stage is in motion.

10. The apparatus of claim 8, further comprising a third optical detector mounted to the pellicle stage, the third optical detector being on an opposite side of the pellicle stage from the first optical detector.

11. The apparatus of claim 8, further comprising a super-luminescent diode (SLD) that, in operation, directs light toward a surface of a pellicle mounted to the pellicle stage.

12. The apparatus of claim 11, wherein, in operation, the second optical detector scans the pellicle during movement of the pellicle stage toward a pellicle mounting position along a first direction and the light has width along a second direction perpendicular to the first direction, the width being at least as large as width of the pellicle.

13. The apparatus of claim 8, wherein, in operation, the second optical detector generates a second plurality of images by generating at least one first image at a first depth above a surface of the pellicle and generating at least one second image at a second depth below the surface of the pellicle.

14. The apparatus of claim 13, wherein, in operation, an optical module of the second optical detector is stepped in a direction of the first and second depths during the generating a second plurality of images.

15. A method, comprising:
    placing a mask assembly on a mask stage in a mounting apparatus;
    placing a pellicle assembly on a pellicle stage in the mounting apparatus;
    generating a second plurality of images by scanning the pellicle assembly by a second interferometer attached to a side of the mask stage and positioned in the mounting apparatus;
    determining whether a number of particles on a pellicle of the pellicle assembly exceeds a threshold value; and
    in response to the number of particles not exceeding the threshold value:
        forming a protected mask assembly by mounting the pellicle assembly to the mask assembly; and
        performing semiconductor processing on a semiconductor wafer by using the protected mask assembly.

16. The method of claim 15, further comprising generating a first plurality of images by scanning a mask of the mask assembly by a first interferometer positioned in the mounting apparatus.

17. The method of claim 15, wherein generating the second plurality of images comprises:
    capturing at least one first image at a depth above a surface of the pellicle;
    capturing at least one second image at a depth below the surface of the pellicle; and
    stepping an optical module of the second interferometer in a direction perpendicular to the pellicle surface between the first and second depths.

18. The method of claim 15, wherein the side is a side distal a mask mounting position.

19. The method of claim 15, further comprising generating a three-dimensional interference wave map by combining the second plurality of images.

20. The method of claim 19, further comprising determining size and position of at least one particle based on the interference wave map.

* * * * *